United States Patent
Vreman et al.

(10) Patent No.: US 11,411,163 B2
(45) Date of Patent: Aug. 9, 2022

(54) PACKAGING FOR ULTRASONIC TRANSDUCERS

(71) Applicant: Intel Corporation, Santa Clara, CA (US)

(72) Inventors: Gerrit J. Vreman, Shingle Springs, CA (US); Mohamed A. Abdelmoneum, Portland, OR (US); Satoshi Suzuki, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 498 days.

(21) Appl. No.: 16/465,547

(22) PCT Filed: Dec. 30, 2016

(86) PCT No.: PCT/US2016/069385
§ 371 (c)(1),
(2) Date: May 30, 2019

(87) PCT Pub. No.: WO2018/125185
PCT Pub. Date: Jul. 5, 2018

(65) Prior Publication Data
US 2020/0020843 A1    Jan. 16, 2020

(51) Int. Cl.
*H01L 41/047* (2006.01)
*H01L 41/09* (2006.01)
(Continued)

(52) U.S. Cl.
CPC ........ *H01L 41/0474* (2013.01); *B06B 1/0644* (2013.01); *H01L 41/0533* (2013.01);
(Continued)

(58) Field of Classification Search
CPC . H01L 41/0474; H01L 41/0533; H01L 41/09; H01L 41/18
(Continued)

(56) References Cited

U.S. PATENT DOCUMENTS

| | | | |
|---|---|---|---|
| 2002/0047501 A1* | 4/2002 | Tsuda ................... | H03H 9/0585 310/348 |
| 2005/0184624 A1* | 8/2005 | Hasegawa ............ | A61B 8/4281 310/334 |

(Continued)

FOREIGN PATENT DOCUMENTS

| WO | 2016042928 A1 | 3/2016 |
|---|---|---|
| WO | 2018125185 A1 | 7/2018 |

OTHER PUBLICATIONS

PCT Sep. 20, 2017 International Search Report and Written Opinion for International Appliication No. PCT/US2016/069385; 12 pages.

*Primary Examiner* — Derek J Rosenau
(74) *Attorney, Agent, or Firm* — Akona IP

(57) ABSTRACT

Aspects of the embodiments are directed to systems and devices that include a piezo-electric element comprising a top-side electrode and a bottom-side electrode; a metal contact pad electrically connected to the bottom-side electrode; an electrode electrically connected to the top-side electrode; and an encasement encasing the piezo-electric element. The piezo-electric element can be prepared to include steps and metallization for use in one or more types of packaging.

20 Claims, 26 Drawing Sheets

(51) Int. Cl.
  *H01L 41/053*  (2006.01)
  *B06B 1/06*    (2006.01)
  *H01L 41/18*   (2006.01)
  *H01L 41/25*   (2013.01)
  *H01L 41/338*  (2013.01)

(52) U.S. Cl.
  CPC .............. *H01L 41/09* (2013.01); *H01L 41/18* (2013.01); *H01L 41/25* (2013.01); *H01L 41/338* (2013.01)

(58) Field of Classification Search
  USPC .................................................. 310/340, 348
  See application file for complete search history.

(56) References Cited

U.S. PATENT DOCUMENTS

| | | | |
|---|---|---|---|
| 2008/0238261 A1* | 10/2008 | Ohashi | H01L 41/0973 310/340 |
| 2009/0054784 A1 | 2/2009 | Okuda et al. | |
| 2012/0139063 A1 | 6/2012 | Lo et al. | |
| 2014/0276087 A1* | 9/2014 | Corl | B06B 1/0629 600/467 |
| 2014/0284779 A1* | 9/2014 | Hayata | H01L 24/48 257/676 |
| 2017/0288123 A1 | 10/2017 | Hatano et al. | |

* cited by examiner

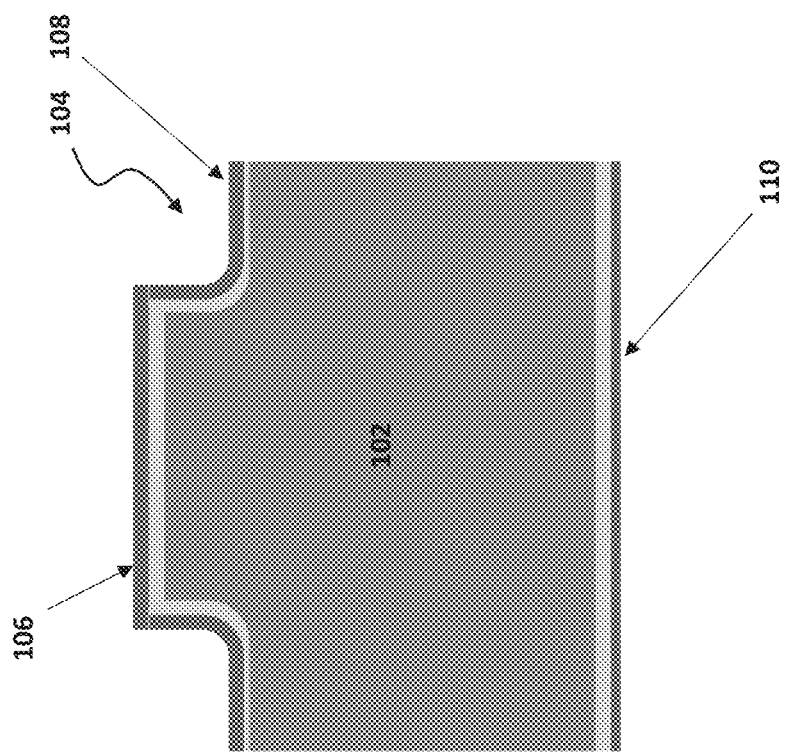

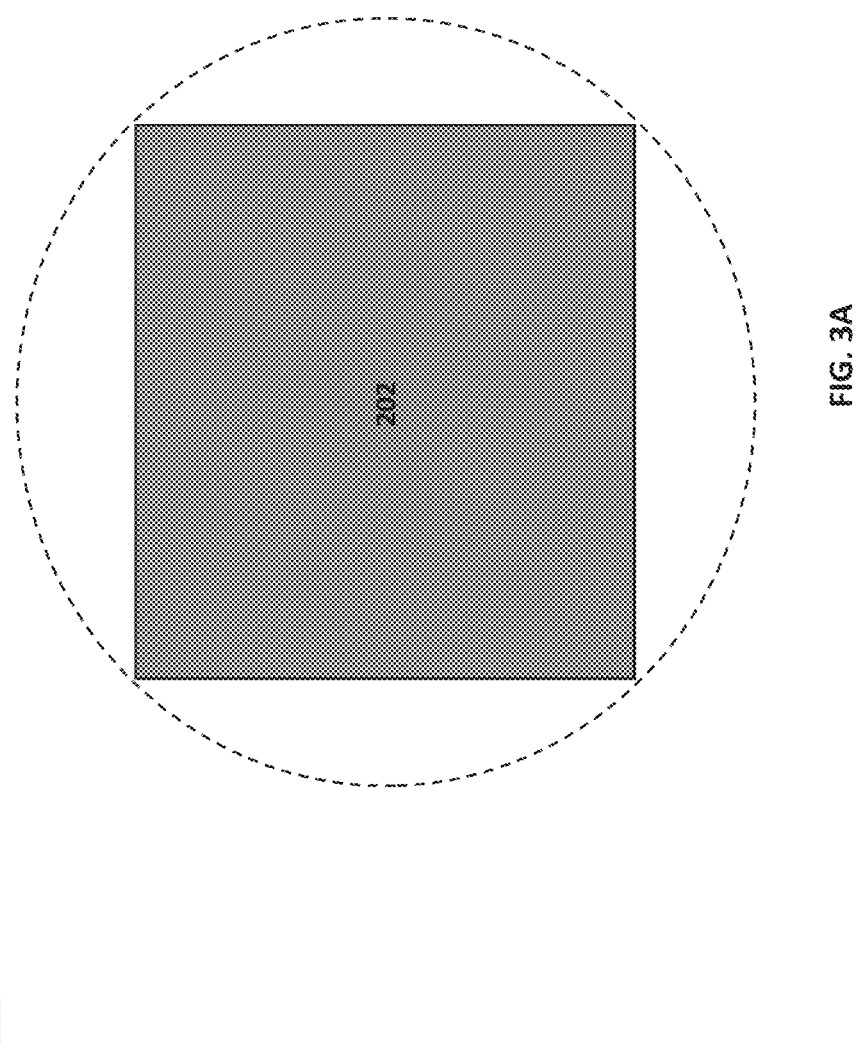

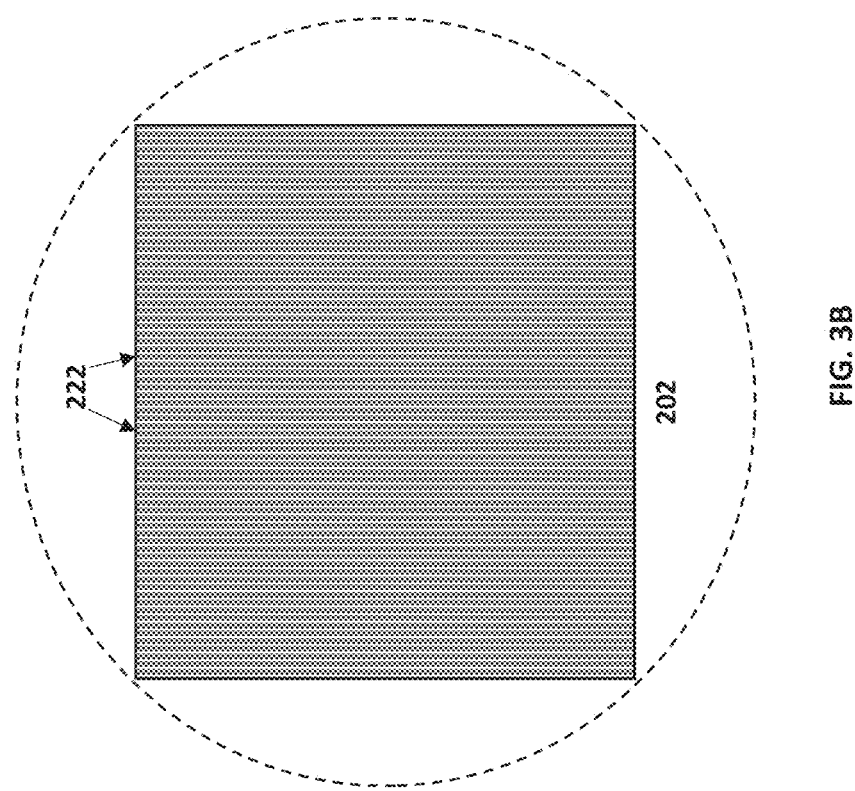

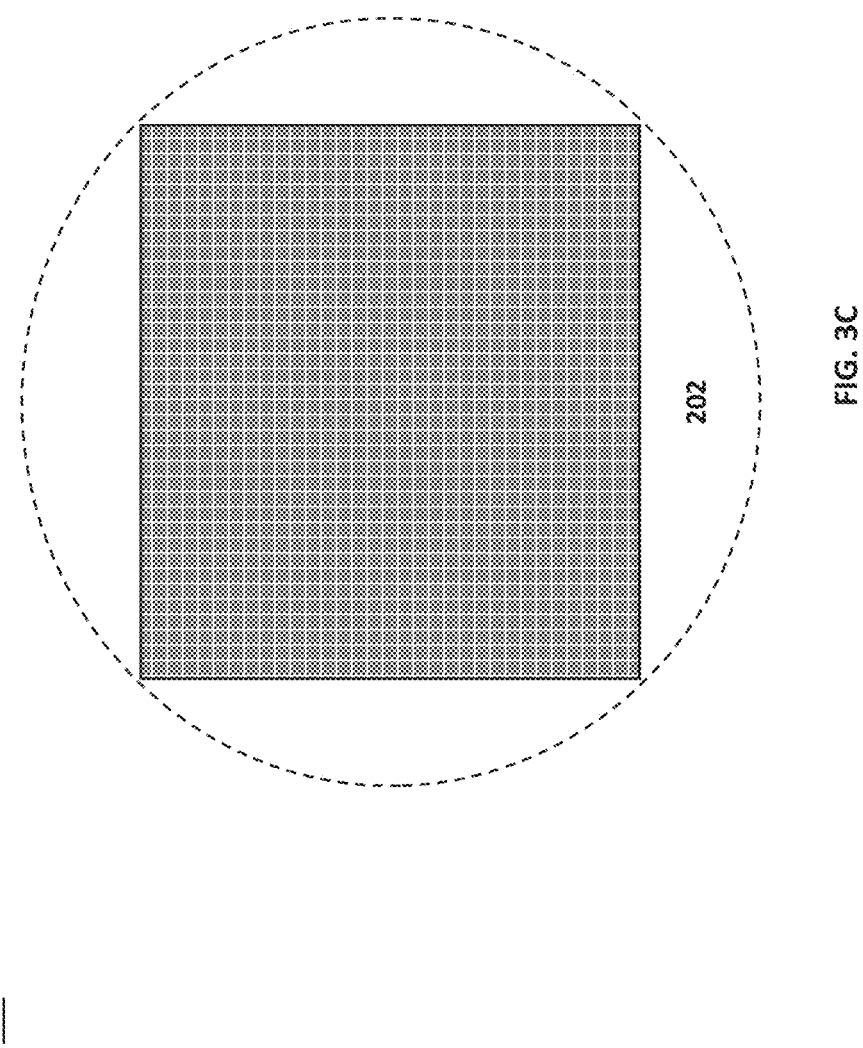

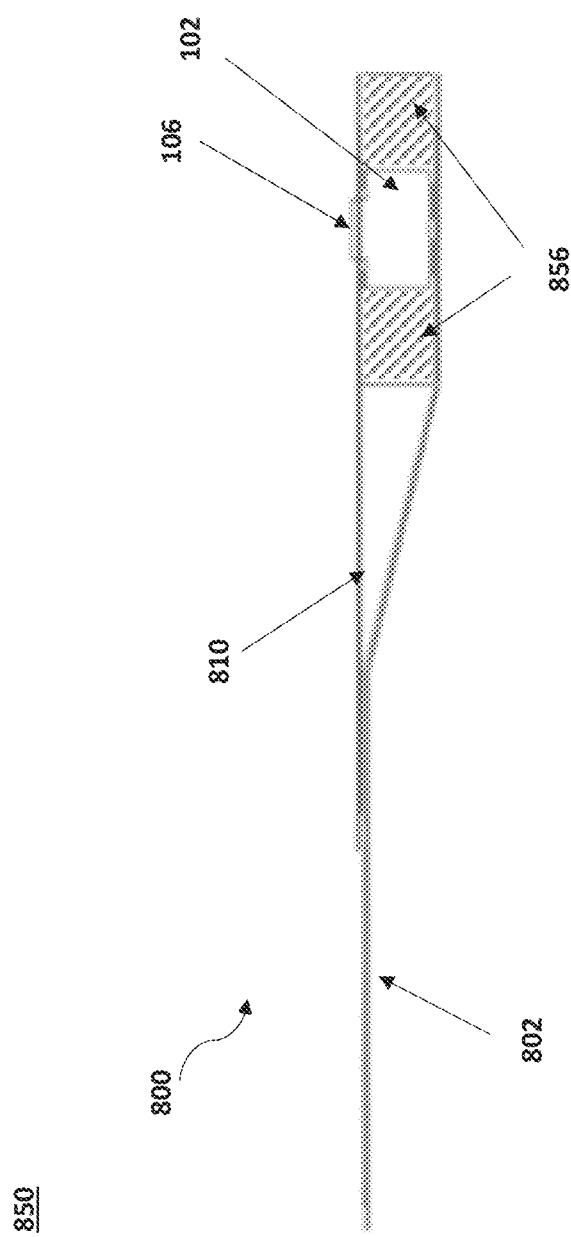

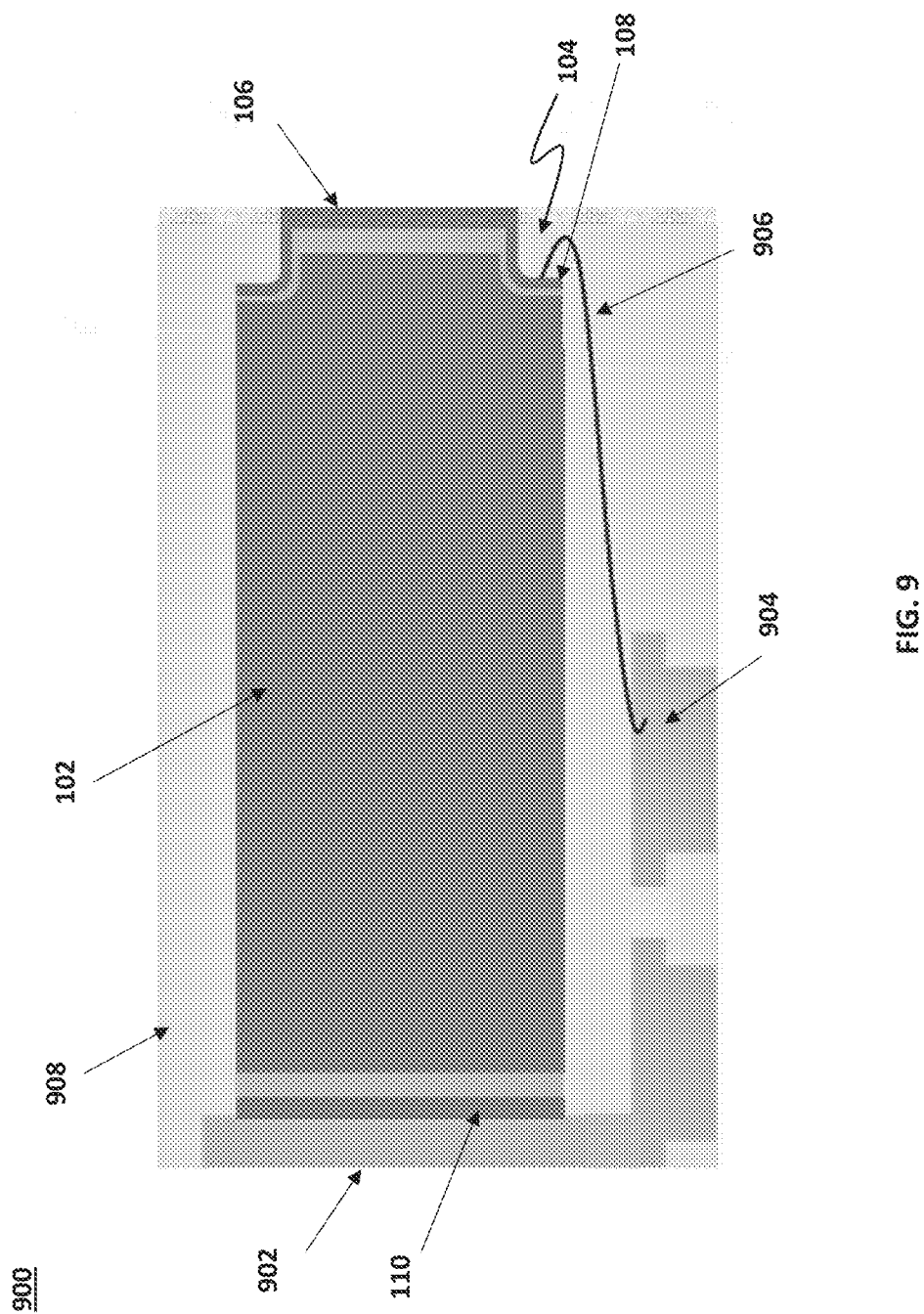

PACKAGING FOR ULTRASONIC TRANSDUCERS

CROSS-REFERENCE TO RELATED APPLICATION

This application is a national stage application under 35 U.S.C. § 371 of PCT International Application Serial No. PCT/US2016/069385, filed on Dec. 30, 2016 and entitled "PACKAGING FOR ULTRASONIC TRANSDUCERS," which is hereby incorporated by reference herein in its entirety.

TECHNICAL FIELD

This disclosure pertains to packaging for ultrasonic transducers.

BACKGROUND

Ceramic piezo electric elements have long been used in industry for variety of applications from nondestructive testing to structural health monitoring to sensing. Piezo electric materials such as PZT (lead zirconate titanate) are commonly used at the macro scale level with transducers packaged in metal housing with complicated backing absorbers and front matching layers.

BRIEF DESCRIPTION OF THE DRAWINGS

FIGS. 2A-E are schematic diagrams of a process for forming a piezo element in accordance with embodiments of the present disclosure.

FIGS. 3A-C are schematic diagrams of a top-down view of the trenching and dicing of a piezo wafer or plate in accordance with embodiments of the present disclosure.

FIGS. 8A-B are schematic diagrams of a flex circuit in accordance with embodiments of the present disclosure.

FIG. 9 is a schematic diagrams of a horizontally biased piezo-electric transducer package in accordance with embodiments of the present disclosure.

DETAILED DESCRIPTION

This disclosure describes packaging of piezo-electric transducers that reduce package induced damping of the piezo-electric transducer and increases the coupling of the acoustic energy from the piezo-electric transducer to the medium of the surface the piezo-electric transduces is to be mounted on.

Aspects of the embodiments satisfy electrical interconnect requirements while limiting the acoustic impedance mismatch through a receiving or transmitting substrate by optimizing direct surface area exposure.

Figure 1:
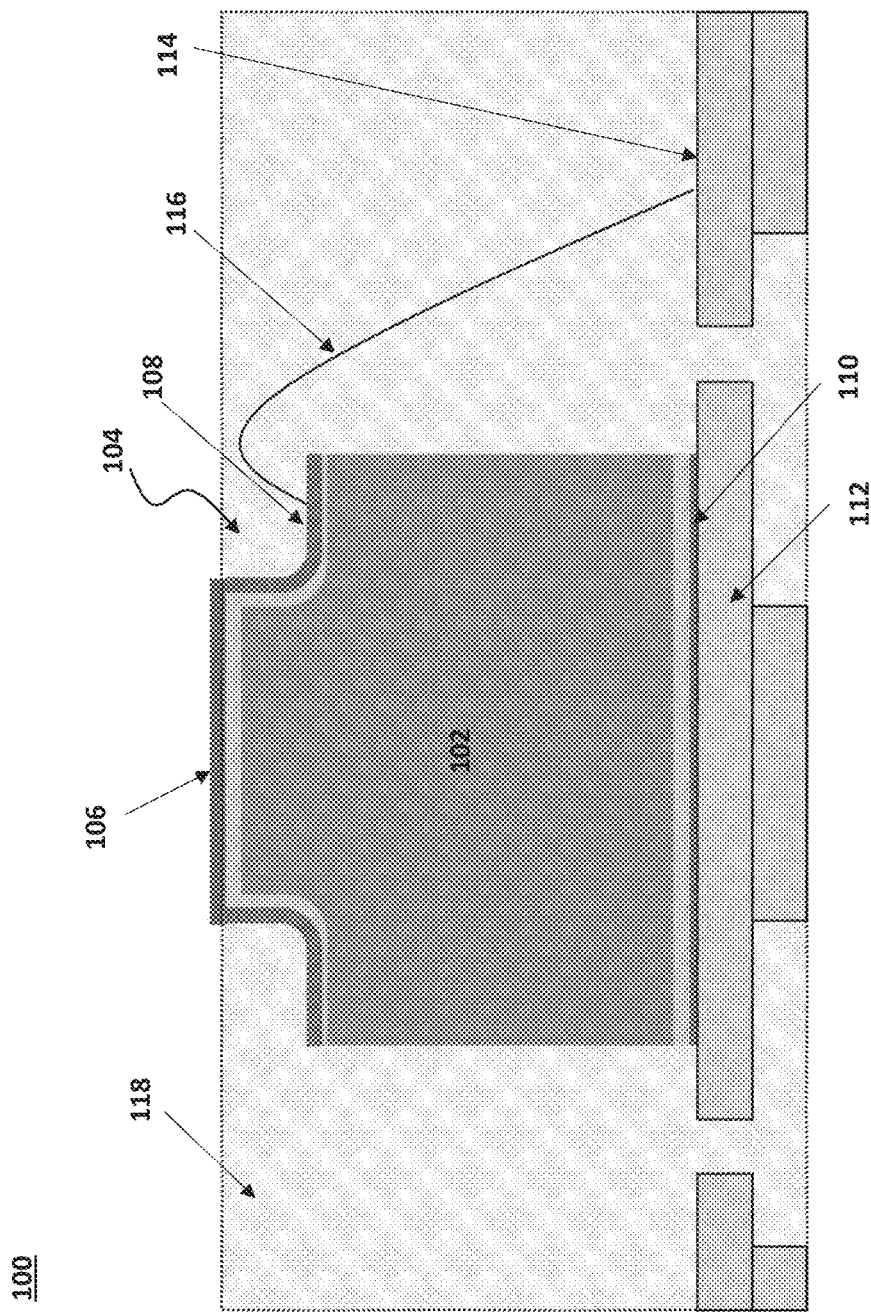
FIG. 1 is a schematic diagram of an example piezo package 100 in accordance with embodiments of the present disclosure.

FIG. 1 is a schematic diagram of an example piezo package 100 in accordance with embodiments of the present disclosure. The example piezo package 100 can be a dual-flat no-lead (DFN) package or a quad-flat no-lead (QFN) package. The piezo package 100 includes a polarized piezo element 102. The piezo element 102 can include a top electrode 106 and a bottom electrode 110 (e.g., a die pad). The top-side of the piezo element 102 can include a shelf 104. Shelf 104 is defined by a step electrode 108. The top electrode 106 is continuous to the step electrode 108 so that a bias applied across the step electrode 108 can actuate the piezo element 102.

The piezo package 100 also includes a bottom-side electrode pad 112. Electrode pad 112 can be electrically coupled to the bottom-side electrode 110. For example, the electrode pad 112 can be coupled to the bottom-side electrode 110 by a die attach epoxy or chip attach epoxy. The piezo package 100 also includes a lead frame electrode 114. Lead frame electrode 114 can be electrically coupled to the step electrode 108 by a wire 116 (e.g., the lead frame electrode 114 can be wire bonded to the step electrode 108).

The piezo package 100 can also include an encapsulant 118. Encapsulant 118 can be a mold compound, silicone, plastic, or other material. The encapsulant 118 can protect the piezo element 102 and the wire 116, as well as other components. In embodiments, the top-side electrode 106 protrudes from the encapsulant 118. For example, the top-side electrode 106 can protrude from the encapsulant 118 by 0.02 mils. Encapsulant 118 promotes reliability and balances mechanical loading of the element which typically reduces transmit and receive acoustic performance.

FIGS. 2A-E are schematic diagrams of a process for forming a piezo element in accordance with embodiments of the present disclosure. The piezo element is prepared using standard semiconductor assembly tools such as singulation saws, plating, and wafer dicing saw. Plated trenched bonding shelves are used to provide a surface for SMT (Surface Mount Technology) or Silver epoxy attach, which establishes the electrical interconnect between the flex circuits and positive or negative polarization. The piezo element's energy coupling performance has a dependency on the interconnect mechanical properties.

Figure 2A:
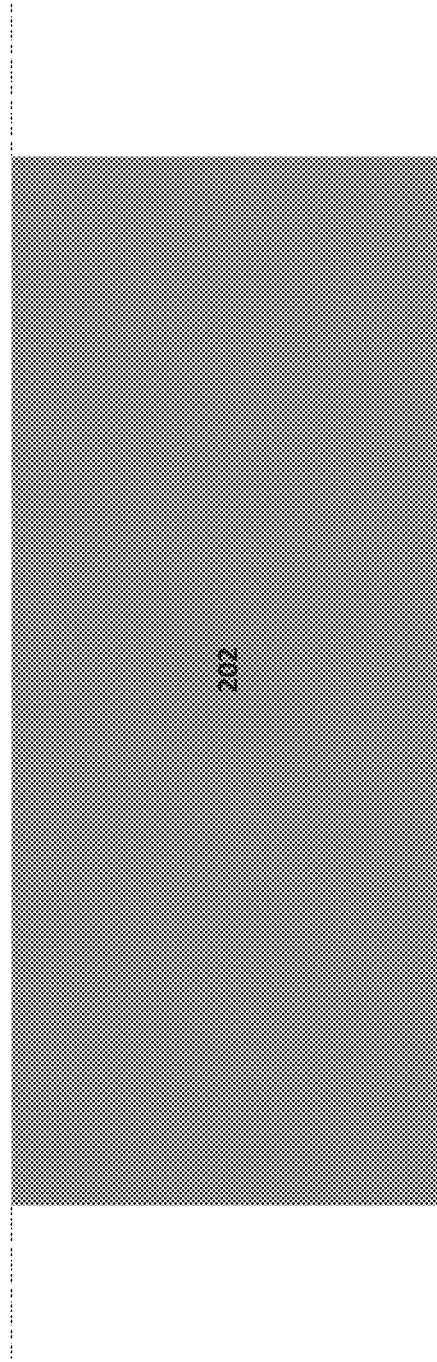
Figure 2B:
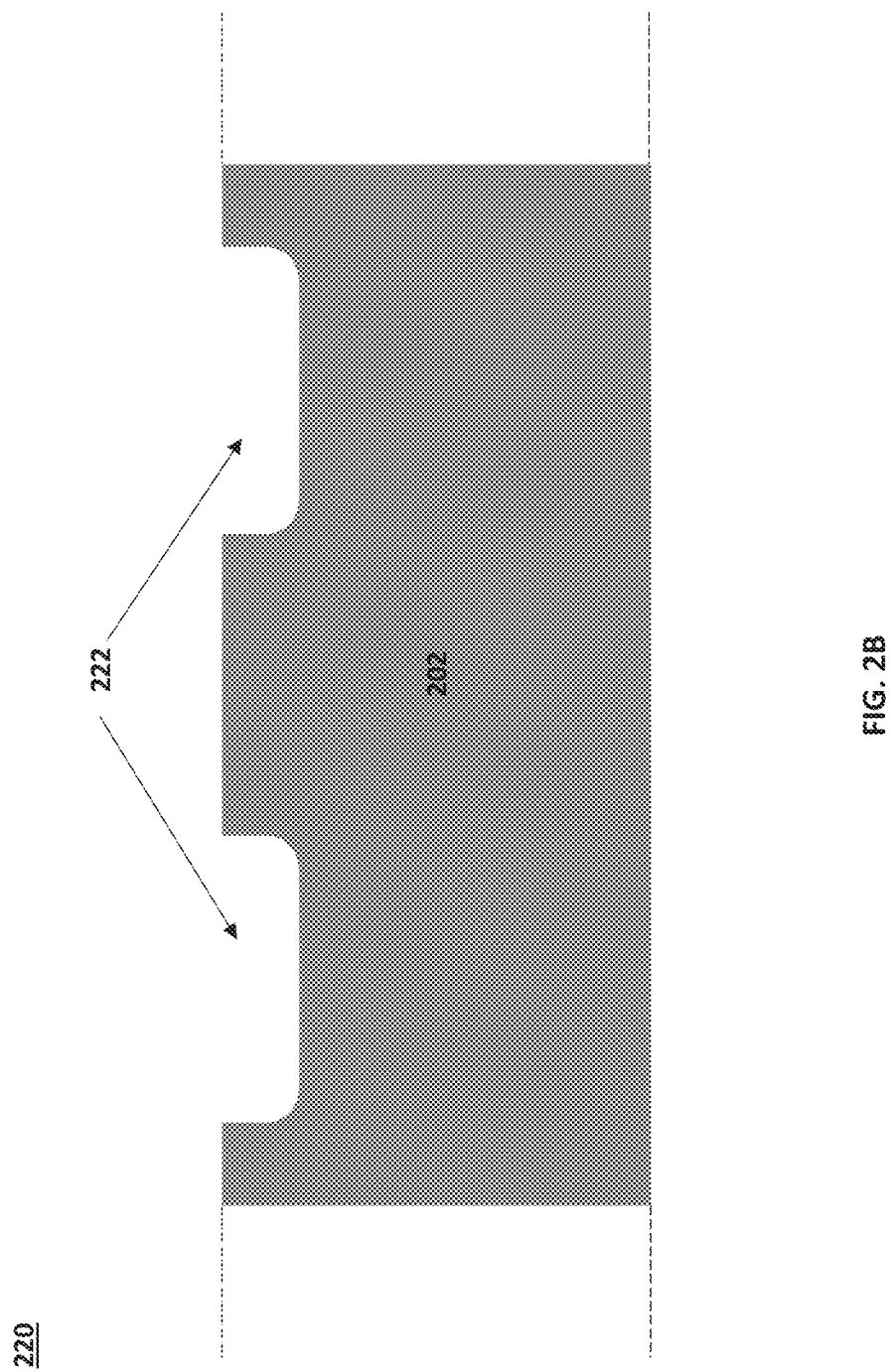

FIG. 2A is a schematic diagram 200 of a circular wafer or rectangular plate (referred to as a substrate herein) of polarized piezo-electric material 202. Piezo material can be a piezo-electric ceramic, lead zirconate titanate (PZT), or other piezo-electric material, FIG. 2B is a schematic diagram 220 illustrating the formation of trenches 222 in the piezo substrate 202. The trenches 222 can be formed by a singulation saw. Turning briefly to FIG. 3A, FIG. 3A is a schematic diagram 300 illustrating an example wafer or rectangular plate 202. FIG. 3B is a schematic diagram 320 illustrating the formation of trenches 222. The trenches can be 0.8 mm wide trenches and formed at a pitch of 1.613 mm. For 30 mm plate, this results in 19 trenches or about 360 dice. A depth of the trenches can be 0.150-0.203 mm. The dimensions listed herein can be scaled and modified depending on the application and sizes desired. The sizes and dimensions are for example purposes.

Figure 2C:
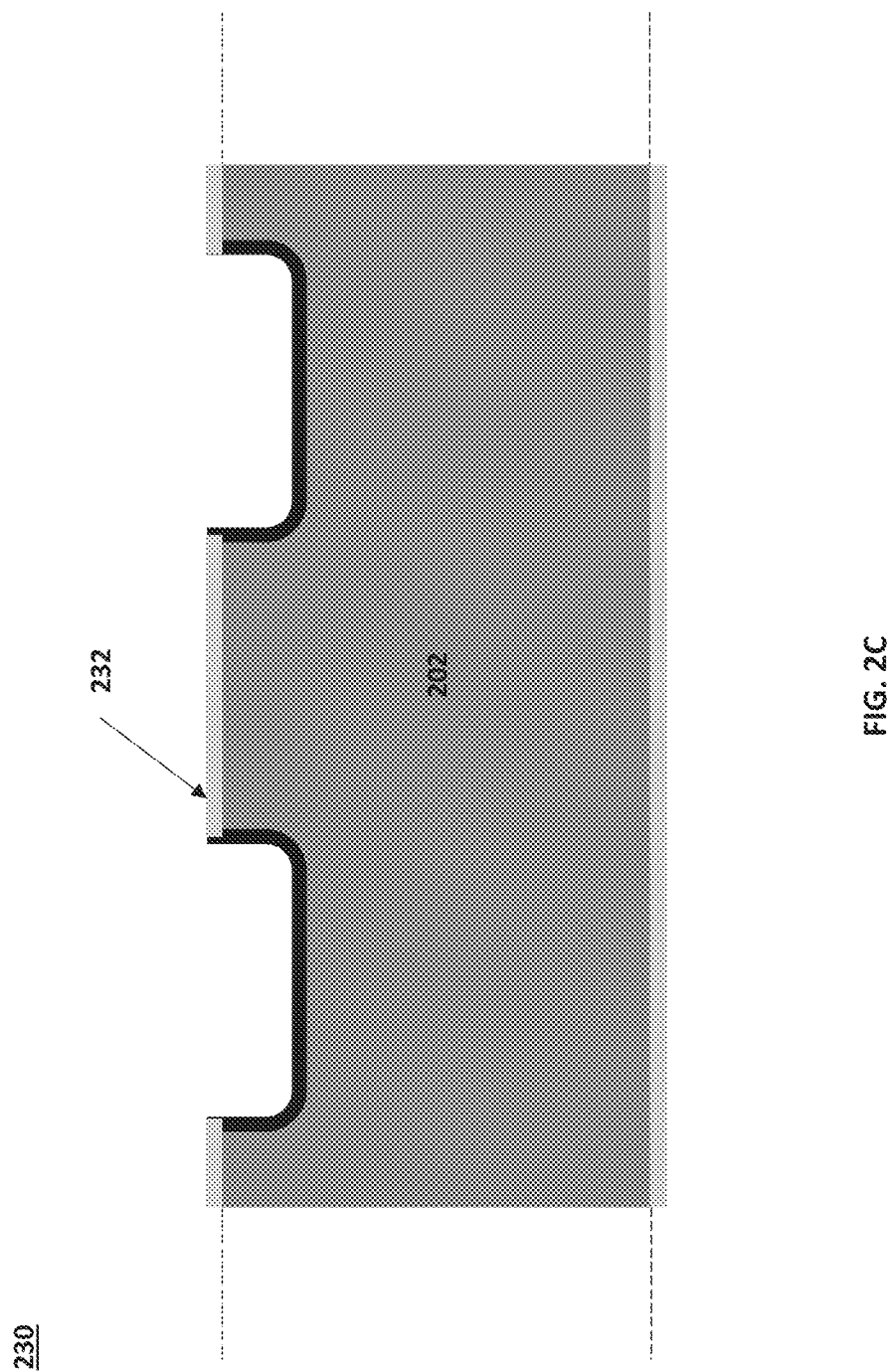
Figure 2D:
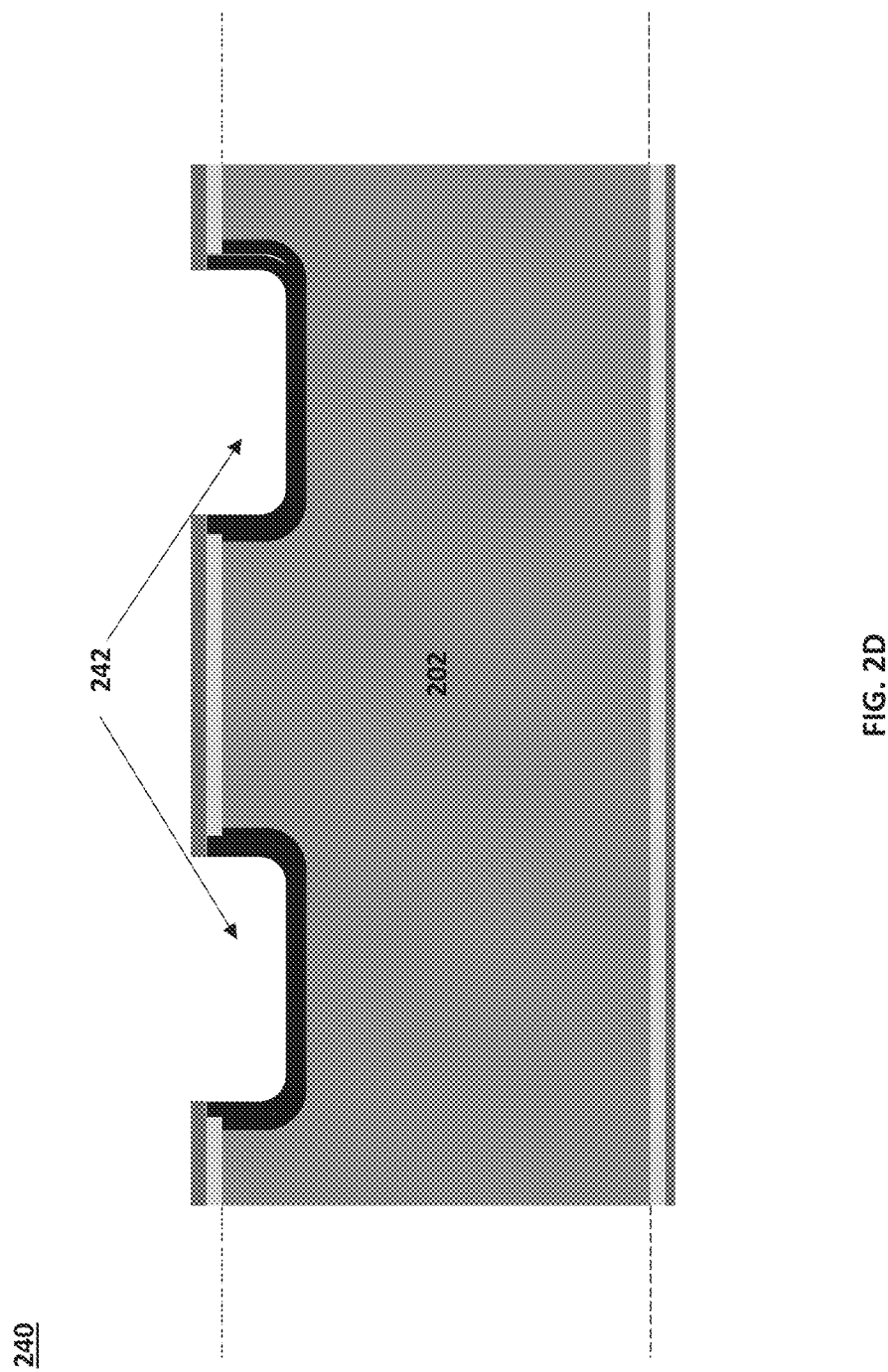

FIG. 2C is a schematic diagram 230 illustrating the formation of a seed layer 232 on the surface of the piezo material 202. The seed layer 232 can be grown through sputter deposition of a seed layer, such as a titanium-based seed layer. FIG. 2D is a schematic diagram 240 illustrating the formation of a metal electrode 242. The metal electrode 242 can be formed through an electroless nickel gold (ENIG) process.

FIG. 2E is a schematic diagram 250 of a piezo element 102, Piezo element 102 is the same or similar to piezo element 102. Piezo element 102 is formed by dicing the trenched and metalized wafer shown in FIG. 2D. The wafer 202 can be diced using a ceramic-compliant dicing blade, such as an 80 µm wide blade. Turning to FIG. 3C, FIG. 3C is a schematic diagram 330 of a wafer 202 that has undergone dicing.

Figure 4A:
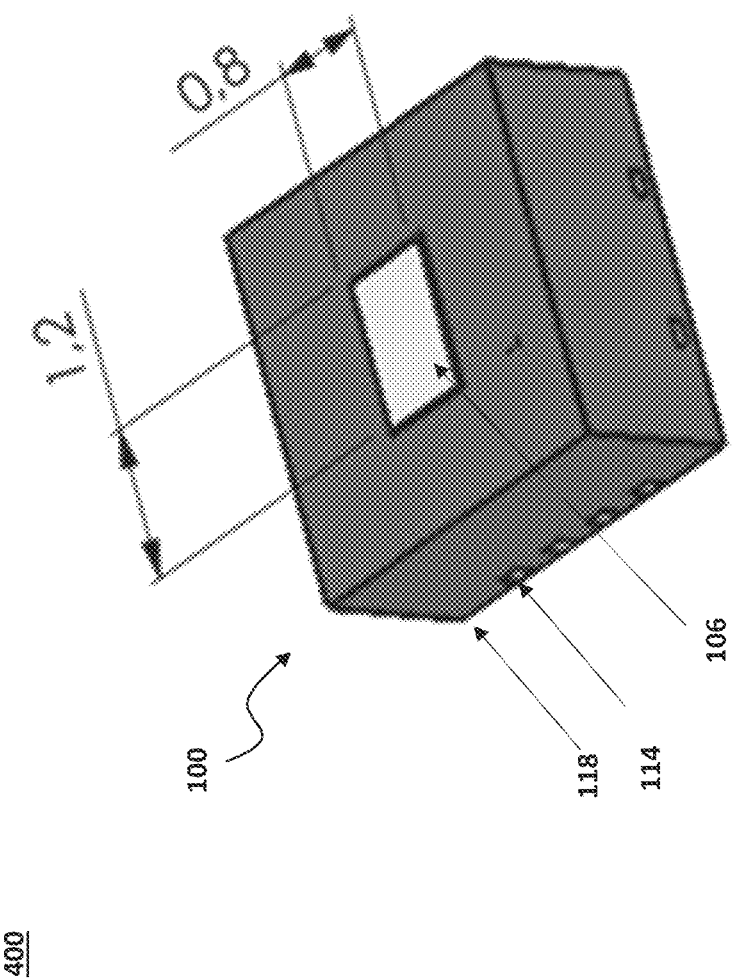
FIGS. 4A-E are schematic diagrams of a dual-flat no-lead packaging for a piezo-electric transducer in accordance with embodiments of the present disclosure.

FIGS. 4A-E are schematic diagrams of a dual-flat no-lead packaging for a piezo-electric transducer in accordance with embodiments of the present disclosure. FIG. 4A is a schematic diagram 400 of an top isometric view of a dual-flat no-lead piezo-electric transducer package 100 in accordance with embodiments of the present disclosure. The top-side electrode 106 is shown protruding from an opening in the encapsulant 118. The lead frame 114 is also shown exposed from the encapsulant 118.

Example dimensions of the exposed top-side electrode 106 are also shown: in this example, the top-side electrode has dimensions 1.2 mm×0.8 mm, though other dimensions are contemplated.

Figure 4B:
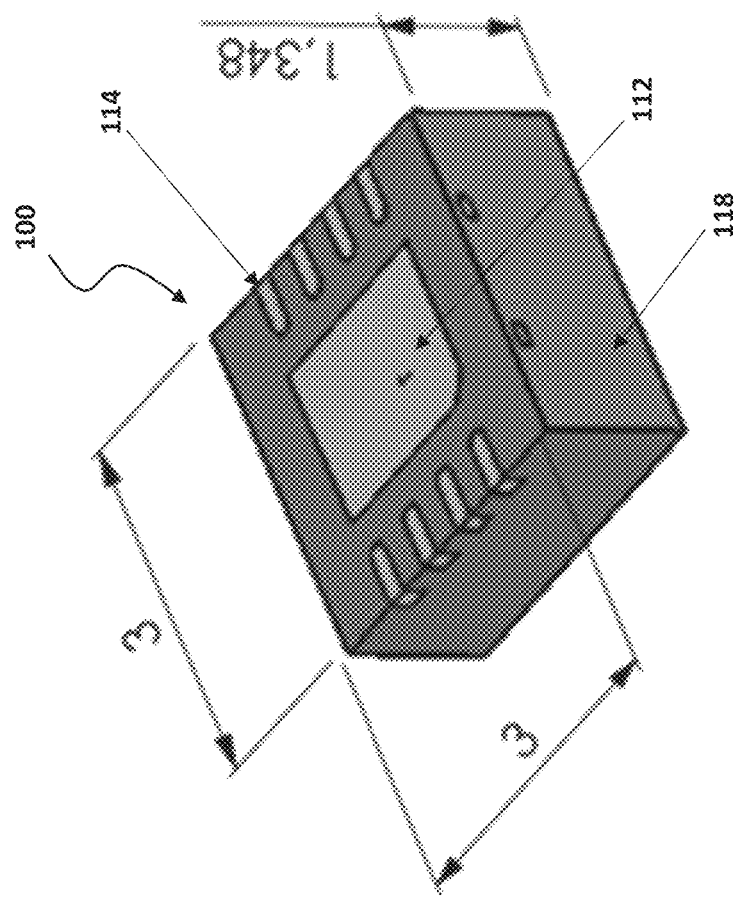
Figure 4C:
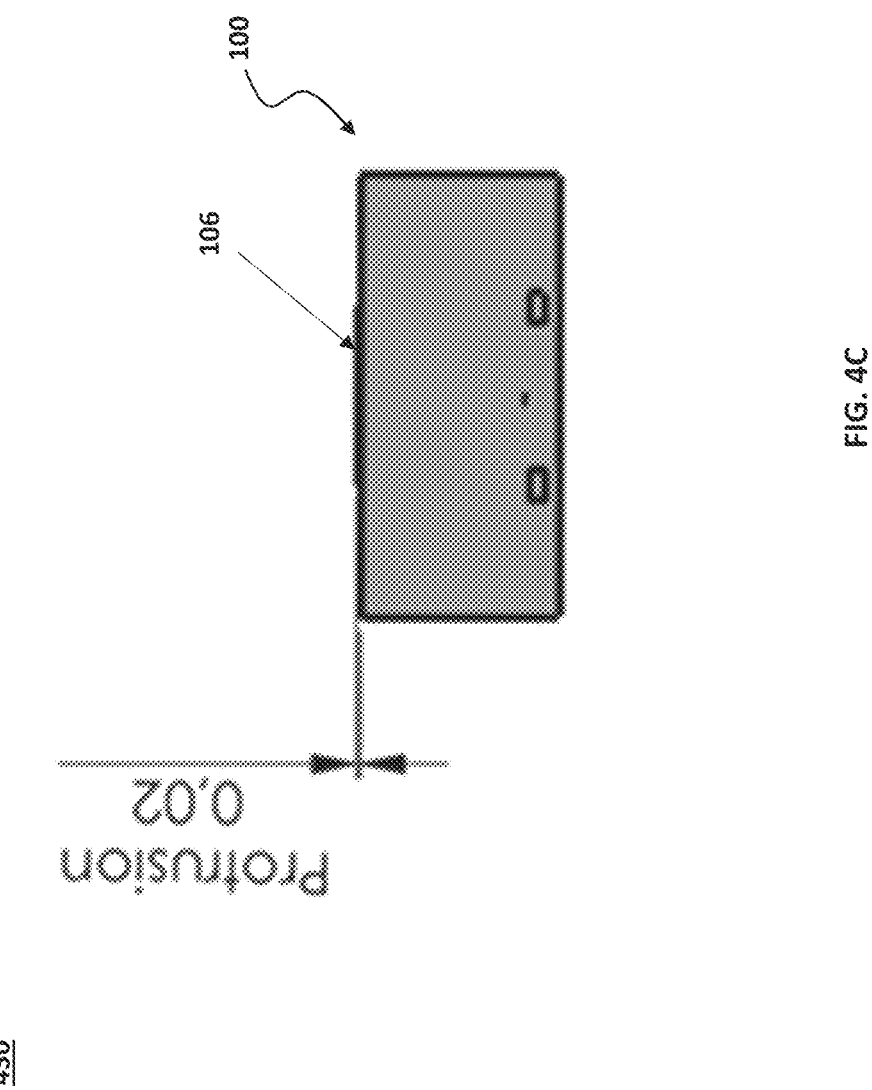

FIG. 4B is a schematic diagram 420 of an bottom isometric view of a dual-flat no-lead piezo-electric transducer package 100 in accordance with embodiments of the present disclosure. The electrode pad (die pad) 112 is shown exposed from the encapsulant 118. FIG. 4B also illustrates the exposed lead frame 114. The DFN package can have dimensions of 3 mm×3 mm, and a height that can be designed to be below 1 mm. FIG. 4C is a schematic diagram 430 illustrating the protruding top-side electrode 106. The top-side electrode 106 can protrude by 2.0 µm or by other amounts depending on the application. The level of protrusion can also be selected to protect the exposed piezo material.

Figure 4D:
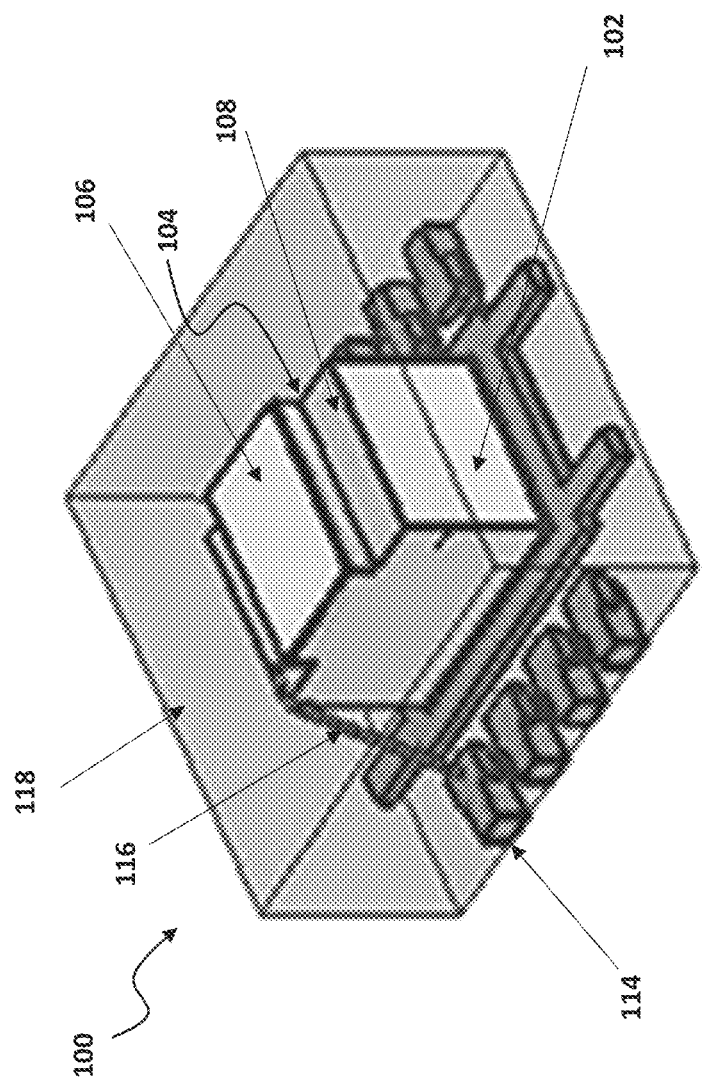

FIG. 4D is a schematic diagram 440 of a semi-transparent isometric view of a dual-flat no-lead piezo-electric transducer package 100 in accordance with embodiments of the present disclosure. The isometric view illustrates the piezo material 102 and the electrode shelf 104. The shelf 104 defines a step electrode 108 that can be electrically connected to a lead frame 114 by a wire 116. The encapsulant 118 is shown as semi-transparent to allow for illustrating the inner components of the dual-flat no-lead piezo-electric transducer package 100.

Figure 4E:
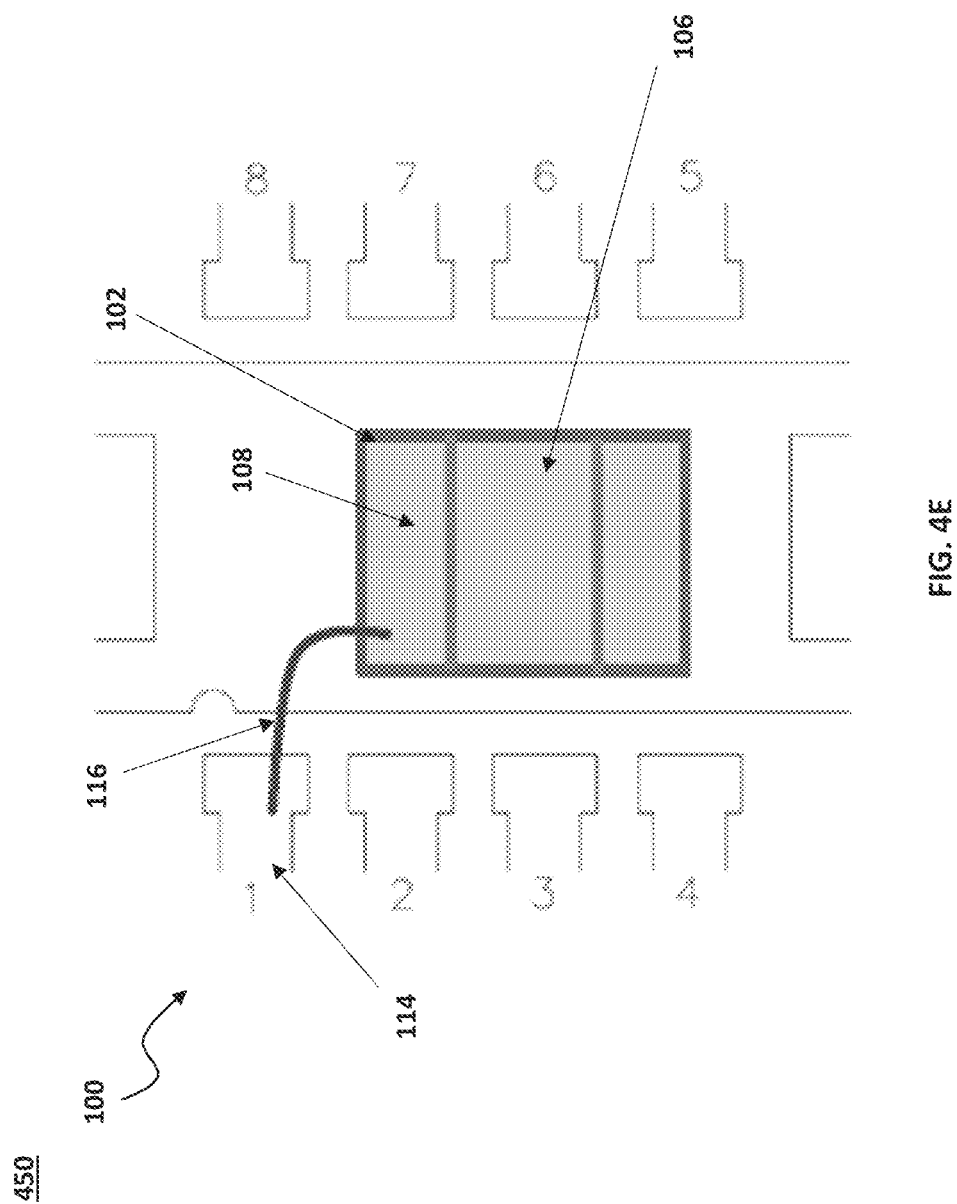
Figure 5:
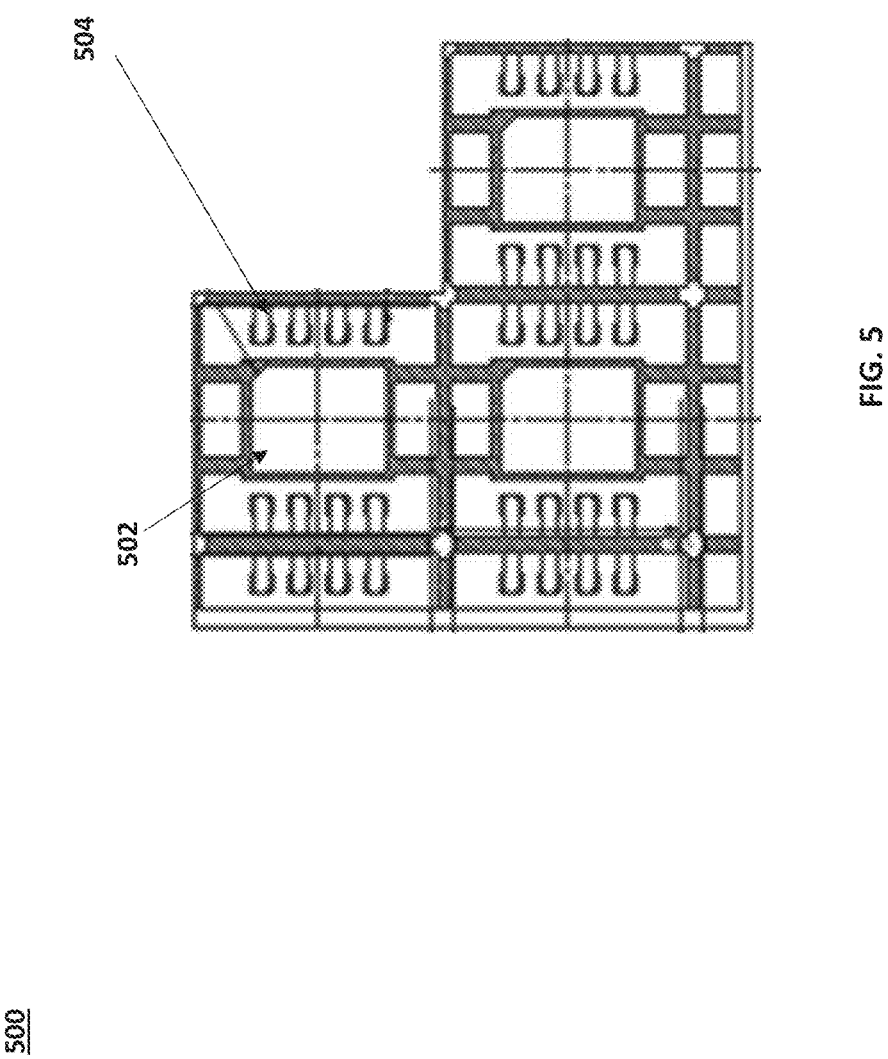
FIG. 5 is a schematic diagram of an example portion of a lead frame and die pad in accordance with embodiments of the present disclosure.

FIG. 4E is a schematic diagram 450 illustrating a top-down view of piezo material 102 on a die pad and connected to a lead frame 114 by a wire. The top-side electrode 106 and step electrode 108 are also shown, FIG. 5 is a schematic diagram 500 of an example portion of a lead frame 504 and die pad 502 in accordance with embodiments of the present disclosure. The piezo-electric element 102 can be placed onto the die pad by a die bonder. Each segment can be separated using standard separation techniques.

Figure 6:
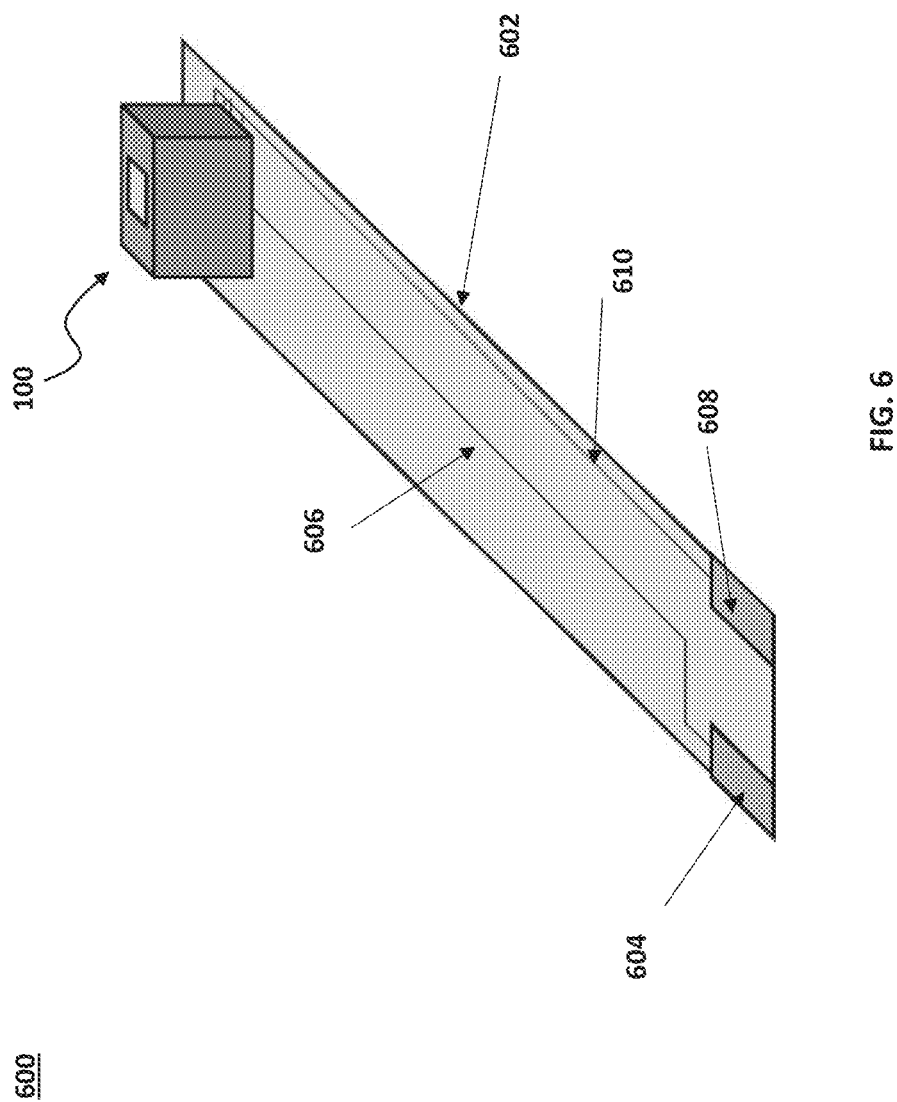
FIG. 6 is a schematic diagram of an example dual-front no-lead package electrically and mechanically connected to a flexible circuit in accordance with embodiments of the present disclosure.

FIG. 6 is a schematic diagram 600 of an example dual-front no-lead package 100 electrically and mechanically connected to a printed circuit substrate 602 in accordance with embodiments of the present disclosure. Printed circuit substrate 602 can be a printed circuit board (PCB), flex circuit, or other type of multi-layered printed circuit carrier. The printed circuit substrate 602 can include a die pad contact that is electrically connected to a landing pad 604 by a printed circuit bus 606. The lead frame can be electrically connected to a landing pad 608 by a printed circuit bus 610. The dual-front no-lead package 100 can be picked and placed or chip shot onto the printed circuit substrate 602. The DFN package 100 can be placed onto the Printed circuit substrate 602 by a surface mount technology or other pick-and-place technology. A reflowed solder paste can be used to secure the DFN package 100 to the printed circuit substrate 602. In embodiments, solder can be used to electrically connect the lead frame to the printed circuit bus 610.

Figure 7A:
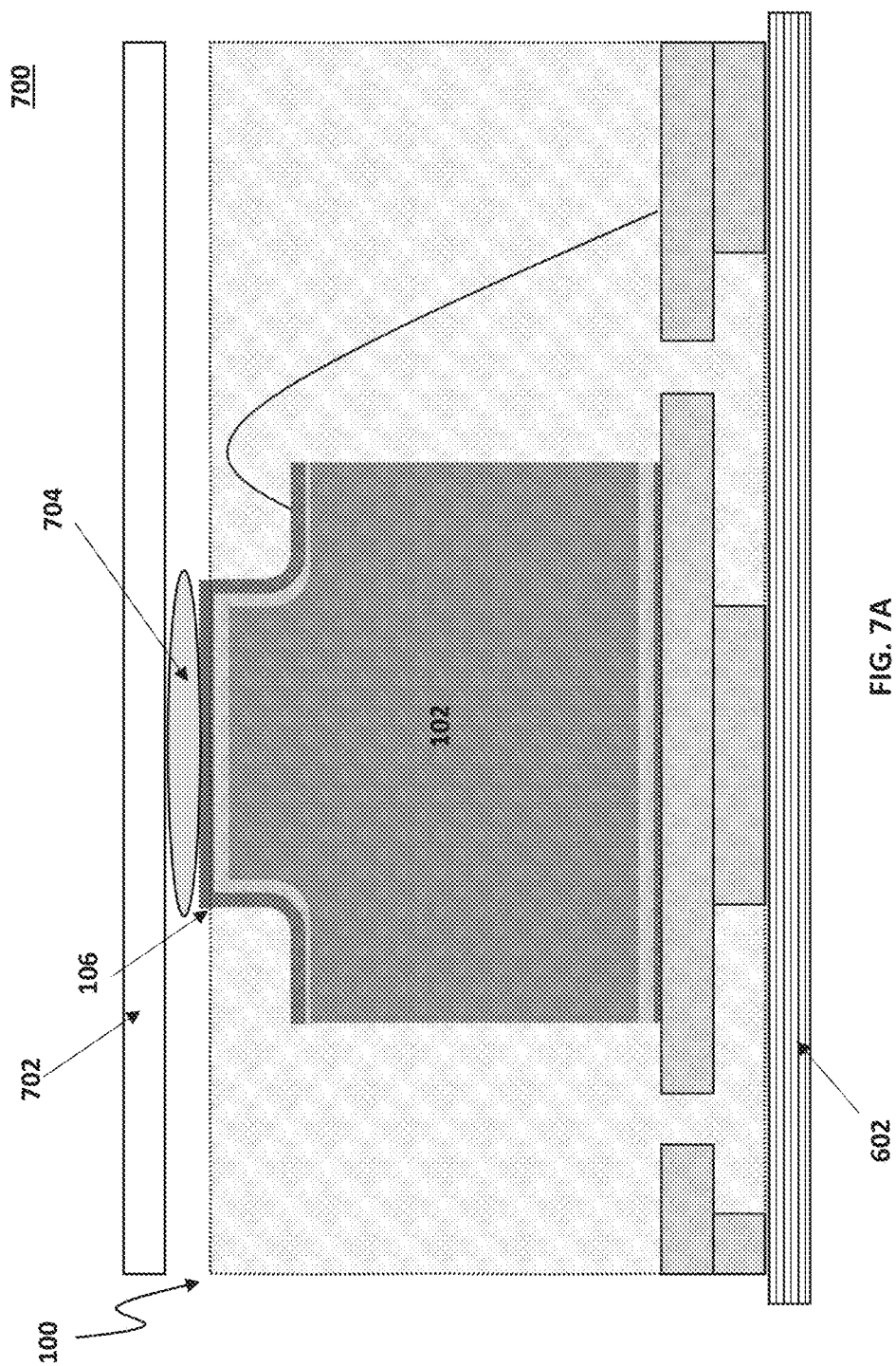
FIG. 7A is a schematic diagram of a piezo-electric transducer package in contact with a surface in accordance with embodiments of the present disclosure.

FIG. 7A is a schematic diagram of a piezo-electric transducer package 100 in contact with a surface 702 in accordance with embodiments of the present disclosure. The piezoelectric transducer 100 can be attached to a surface 702 by a bonding material 704. Bonding material 704 can be a bonding glue, epoxy, or other adhesive material. In some embodiments, a bonding material is not used, and other clamping techniques can be utilized, such as mechanical clamping. The bonding material 704 can bond the protruding electrode 106 to the surface 702. Surface 702 can be a glass surface, such as a cover glass of a display of a device.

The piezoelectric transducer package can be electrically connected to a printed circuit substrate 602, which can be a PCB or flex circuit or other substrate. The piezo-electric transducer package can receive and/or transmit control signals through the printed circuit substrate 602.

Figure 7B:
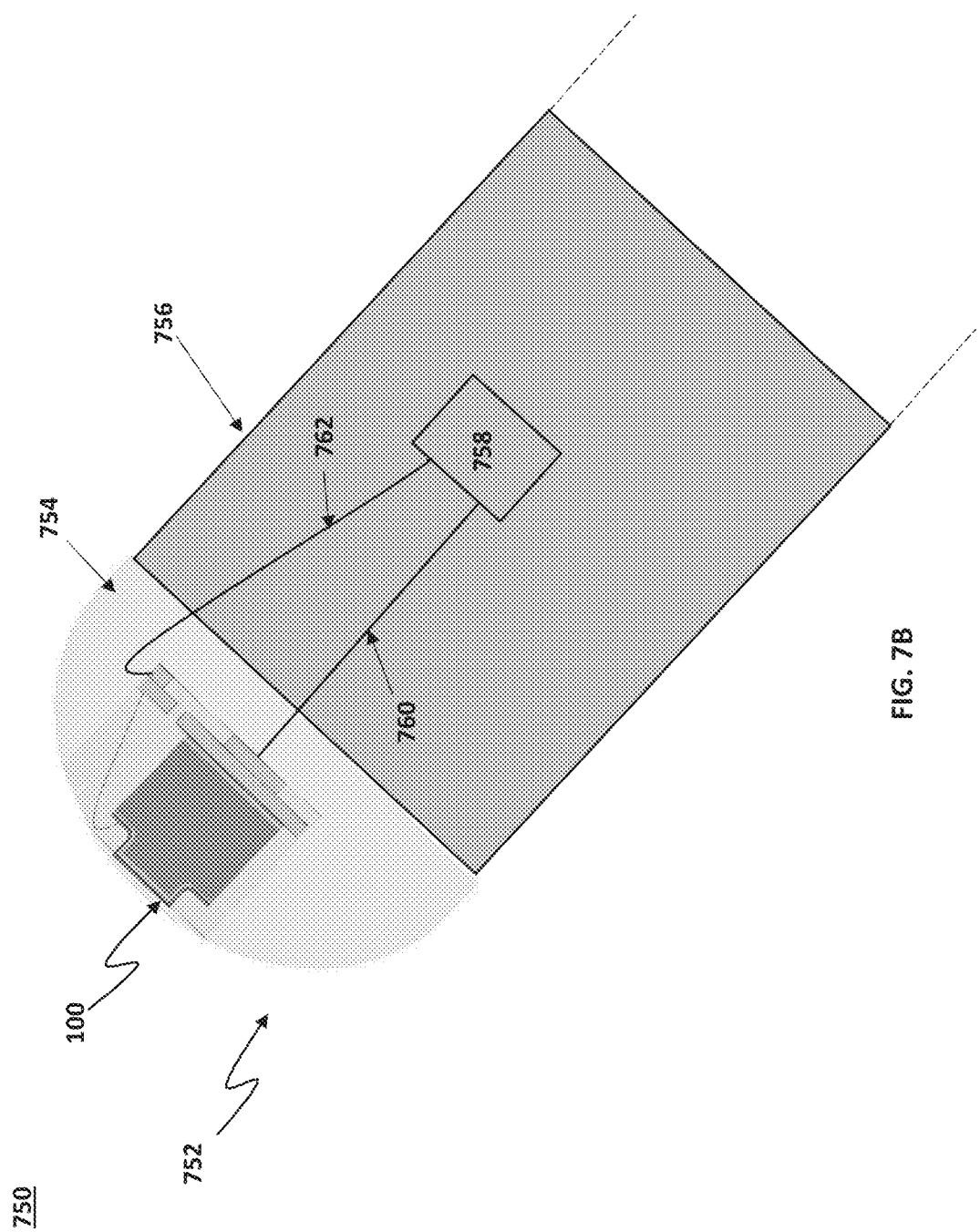
FIG. 7B is a schematic diagram of an active probe pen that includes a piezo-electric transducer package in accordance with embodiments of the present disclosure

FIG. 7B is a schematic diagram 750 of an active probe pen 752 that includes a piezo-electric transducer package 100 in accordance with embodiments of the present disclosure. The active probe pen 752 includes a pen housing 756 and a probe encasement 754. Probe encasement 754 can encase the piezo-electric transducer package 100. The probe encasement 754 can include an interface material to facilitate the acoustic conduction from the piezo-electric element to a target material.

The active probe pen 752 housing 756 can house electrical components 758 that can provide control signals and/or power to the piezo-electric transducer. The electrical components can be electrically connected to the piezo-electric transducer package 100 by wires 760 and 762.

Figure 8A:
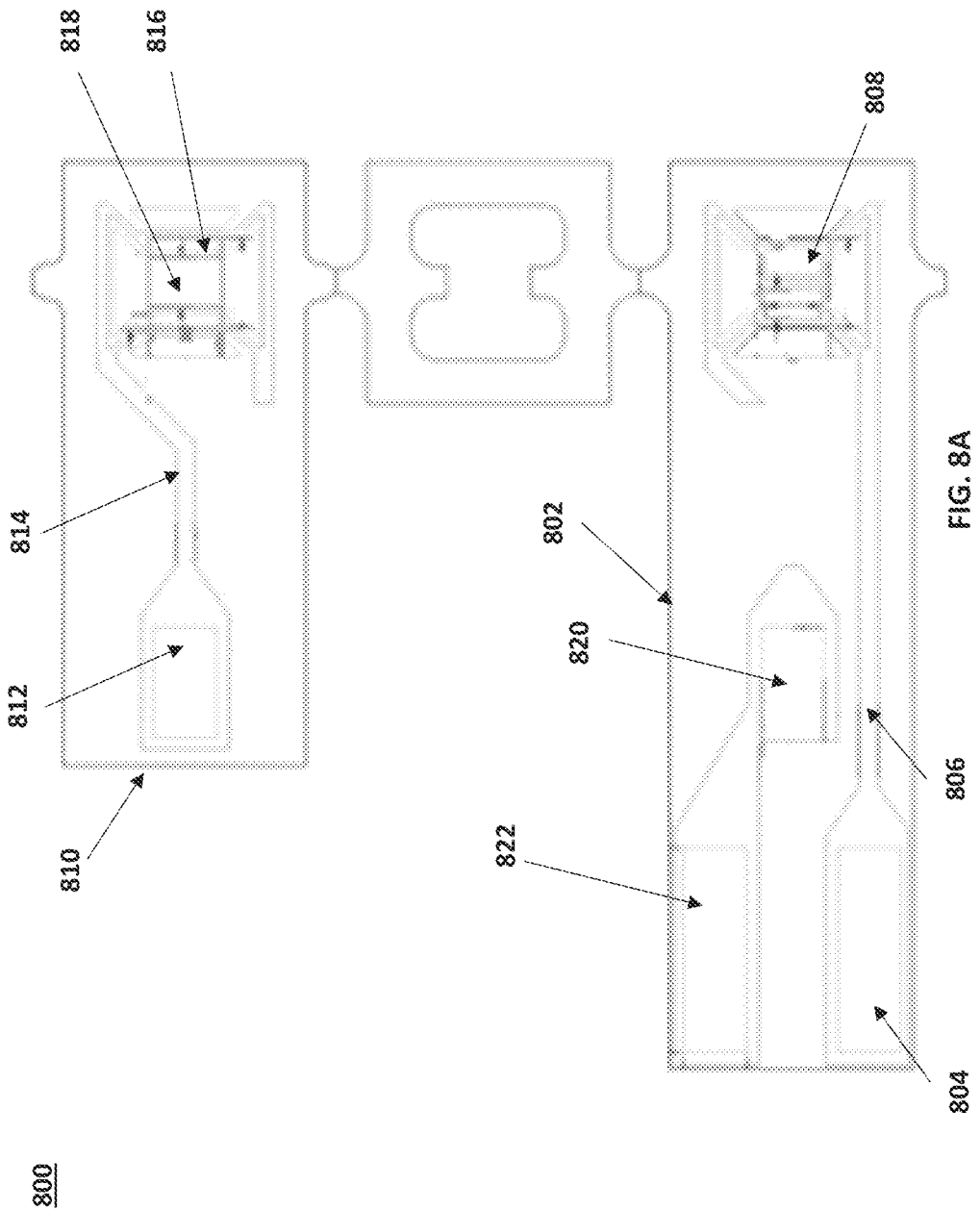

FIGS. 8A-B are schematic diagrams of a flex circuit 800 in accordance with embodiments of the present disclosure. In FIG. 8A, the piezo-electric element 102 can be mounted onto a flex circuit 800. Flex circuit 800 includes a base substrate 802 and a top substrate 810. Base substrate 802 includes a die pad 808 that can electrically connect to a bottom electrode of a piezo-electric element 102. The bottom electrode of the piezo-electric element 102 can be affixed to the die pad 808 by a solder paste reflow process. The die pad 808 can be electrically connected to an electrode 804 by a printed circuit wire 806. The base substrate 802 can also include a contact pad 820 that is electrically connected to another electrode 822.

The flex circuit 800 also includes a top substrate 800. Top substrate 800 includes a through hole 818. Adjacent to through hole 818 are electrical contacts 816. Electrical contacts 816 can make contact with step electrodes of the piezo-electric element 102. The electrical contacts 816 can be electrically connected to a contact pad 812 by a printed circuit wire 814. Contact pad 812 can be aligned with contact pad 820 and when in contact, contact pad 812 can be electrically coupled to electrode 822 through contact pad 820.

FIG. 8B is a schematic diagram 850 of a piezo-electric element 102 electrically connected to a flex circuit 800. The base substrate 802 can be aligned in a matrix with the die pad facing up; the top substrate 810 can also be aligned in a matrix with the contacts 816 facing up—the top substrate 810 can be in a separate matrix from the base substrate 802. A solder paste or die attach epoxy or ENIG or Ag Epoxy can be applied to both top substrate 810 and bottom substrate 802, independently. A pressure sensitive adhesive lasered sheet can be applied to both matrices. A stiffener 856 can be aligned to one of the matrices. The stiffener 856 can be a low cost injected molded plastic or 2Layer FR4 PCB or other material that meets reflow temperature requirements. The piezo-electric elements 102 can be aligned, face down with the top substrate 810. The piezo-electric element 102 can be placed onto the top substrate 810 by a chip shooter, SMT tool or other process. The bottom substrate 802 is aligned over the top substrate 810 and placed on the top substrate 810. The flex circuit 800 can then undergo a solder flow and heat curing if a solder is used to make connections between the piezo electrodes and the flex circuit electrodes.

In some embodiments, the piezo-electric element can include a protruding top and bottom electrode. The flex circuit can include a through hole via that allows the protruding electrodes to protrude from the flex circuit. The embedded flex circuit can be clamped between two plates or used topside up or upside down.

Figure 8C:
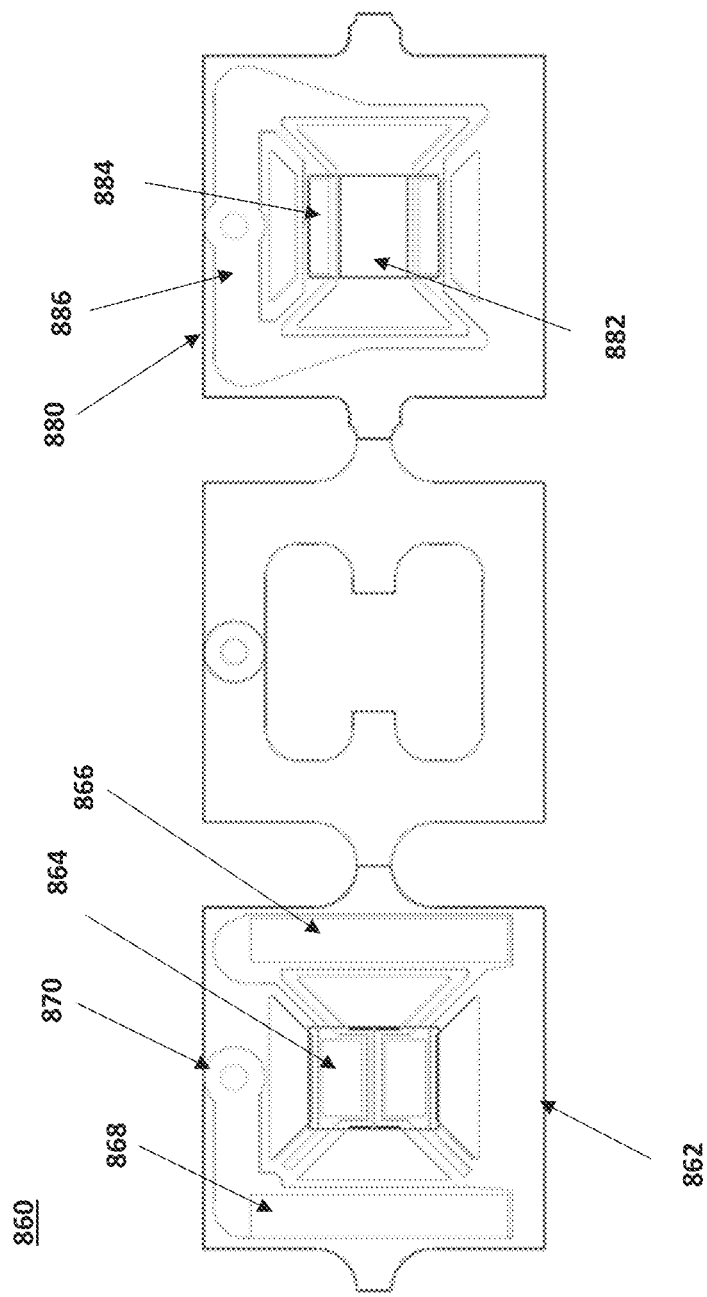
FIGS. 8C-D are schematic diagrams of another flex circuit in accordance with embodiments of the present disclosure.
Figure 8D:
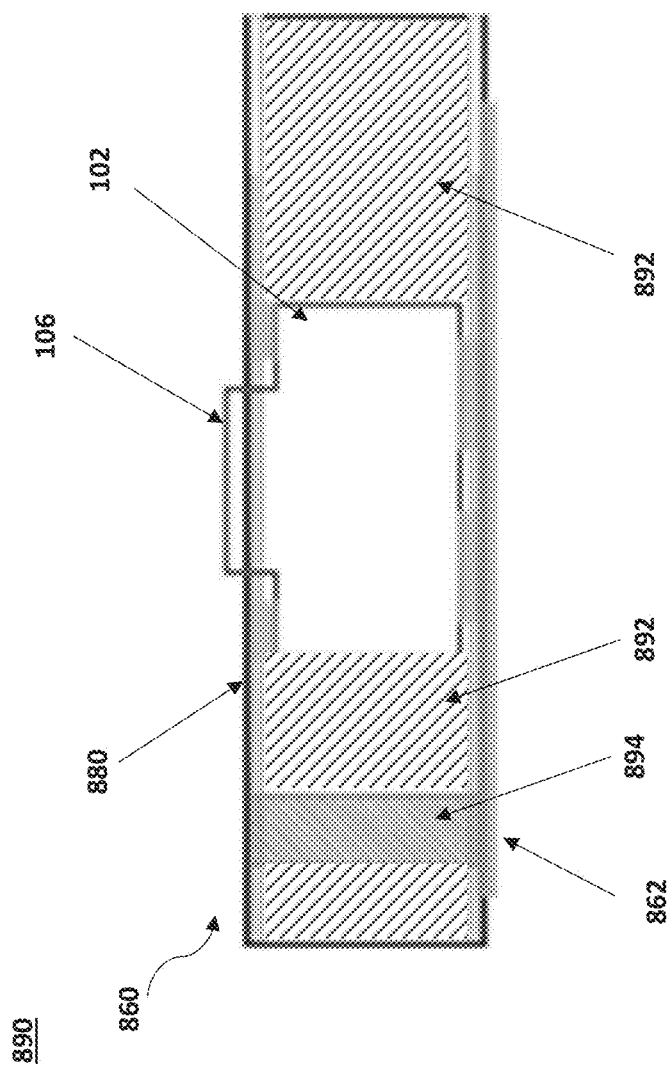

FIGS. 8C-D are schematic diagrams of another flex circuit in accordance with embodiments of the present disclosure. FIG. 8C, illustrates a flex circuit 850 that can has a smaller form factor than that shown in FIGS. 8A-B. The flex circuit 850 includes a bottom side 852 bottom electrode pad 854 that can electrically connect a bottom electrode 110 of a piezo 102 with an electrode 856. The bottom side 852 of the flex circuit 850 also includes an electrode 858 that is electrically coupled to a through-hole via 860. Through hole via 860 can be electrically connected to a top-side electrode 886 by a metalized via, which is shown in FIG. 8D. The top side 880 of flex circuit includes an opening 882 to accommodate a top-side electrode 106 of a piezo 102. The electrode steps/shelfs 108 can contact electrodes 884, which are electrically connected to electrode 886.

FIG. 8D illustrates a piezo 102 soldered between two portions of flex circuit 860. A stiffener 892 can be added between the top side 880 and the bottom side 862 in a similar manner as described above. A through-hole via 894 can be formed in the stiffener and can be metalized to electrically connect an electrode 884 with electrode 868, shown in FIG. 8C.

FIG. 9 is a schematic diagrams of a horizontally biased piezo-electric transducer (HBPET) package in accordance with embodiments of the present disclosure. The HBPET package incorporates a bent or inclined leadframe to allow for standard component assembly. By bending the leadframe 904 (e.g., 90 degrees), the HBPET changes the incident axis of the piezo-electric material 102 from vertical to horizontal. The HBPET package 900 allows the piezo-electric element 102 to contact an edge of a surface without being placed on the surface.

The HBPET package 900 includes a polarized piezoelectric material 902.

Piezo-electric material 102 can be formed in a similar manner as described in FIGS. 2A-2E. The bottom electrode 106 can contact a die pad 902. The lead frame 904 can be bent so that the package profile allows the piezo-electric element 102 to be aligned horizontally. The step electrode 108 can be electrically connected to the lead frame 904 by a wire 906 (e.g., wirebonded connection). The top electrode 106 can contact an edge of a surface.

Figure 10:
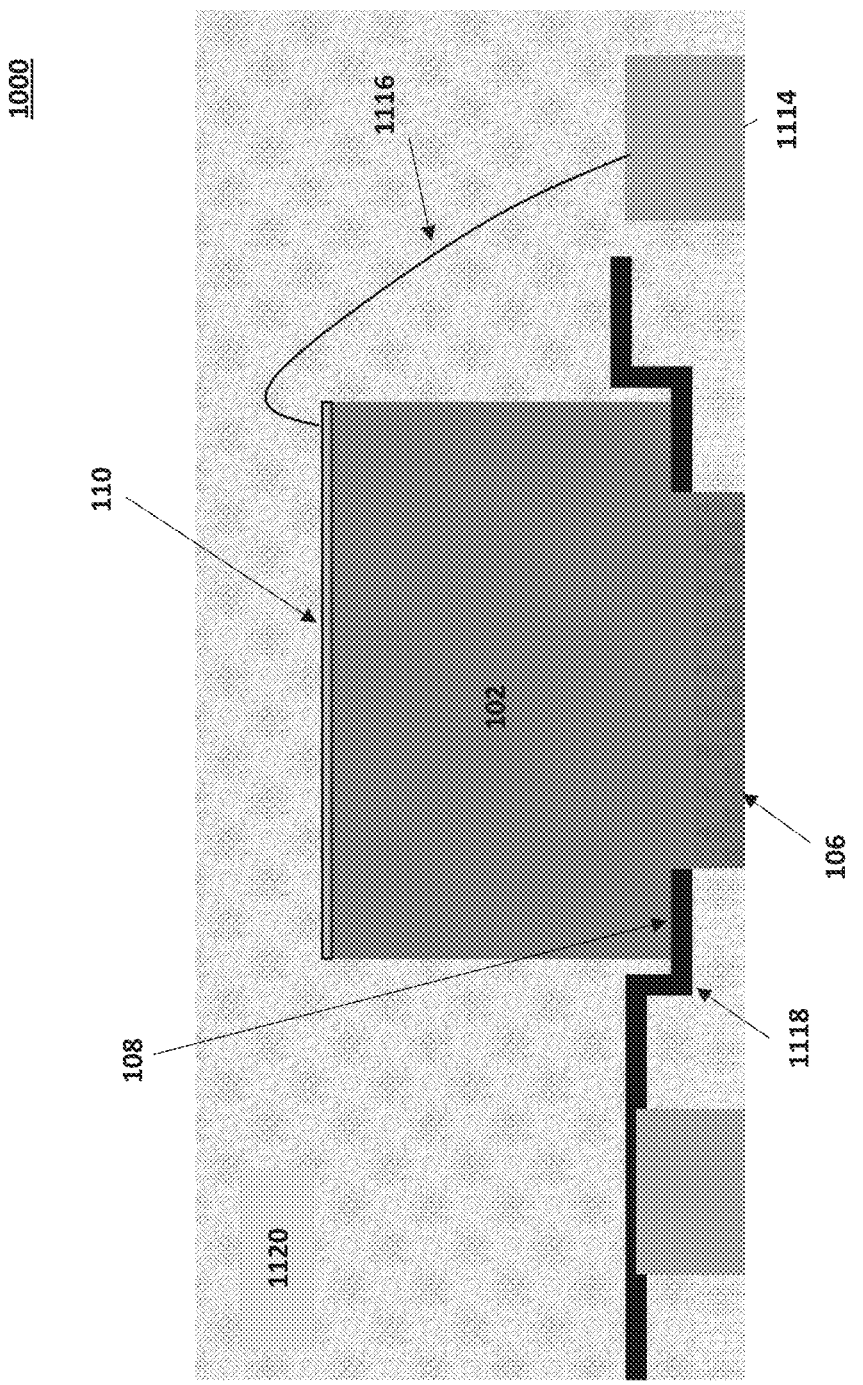
FIG. 10 is a schematic diagram of a piezo-electric transducer package in accordance with embodiments of the present disclosure.

FIG. 10 is a schematic diagram of a piezo-electric transducer package 1000 in accordance with embodiments of the present disclosure. The piezo-electric transducer 1000 (referred to as a pocket lead frame package 1000) can be designed to have the exposed electrode on the same side as the terminal connections. The two electrodes from the lead frame can be used for the terminal connections of the pocket lead frame package 1000. For example, the piezo-electric element 102 can be positioned with the step electrode 108 contacting a first lead frame 1118. The first lead frame 1118 can provide electrical connectivity for the step electrode 108. A second, separate lead frame electrode 1114 can be electrically connected to the bottom electrode 110 by a wire 1116. An encasement 1120 can encase the piezo-electric element 102 and the wire 116, while allowing the lead frames 1118 and 1114 to be exposed. The top electrode 106 can protrude from the encasement 1120 to be the piezo interface from the package 1000. Lead frame package 100 can be manufactured by film assisted molding, in addition to other processes described herein. The top electrode 106 can be exposed from the encasement, and can be on the same plane as the exposed electrode 1114. A polyimide film can be used to protect the exposed electrodes 106 and 1114.

The designed structures described herein provide direct access to a large portion of the surface area of the active electrode of the piezo-electric element, without interference from the electrical interconnect. For example, a metalized glass substrate or metal plate can act as an interconnect, but also causes an impedance mismatch if it is not intended to be the medium which the acoustic signal is driven.

The structure design and materials are selected to use common tools and fixtures that are scalable, enabling low cost and high volume manufacturing.

Figure 11:
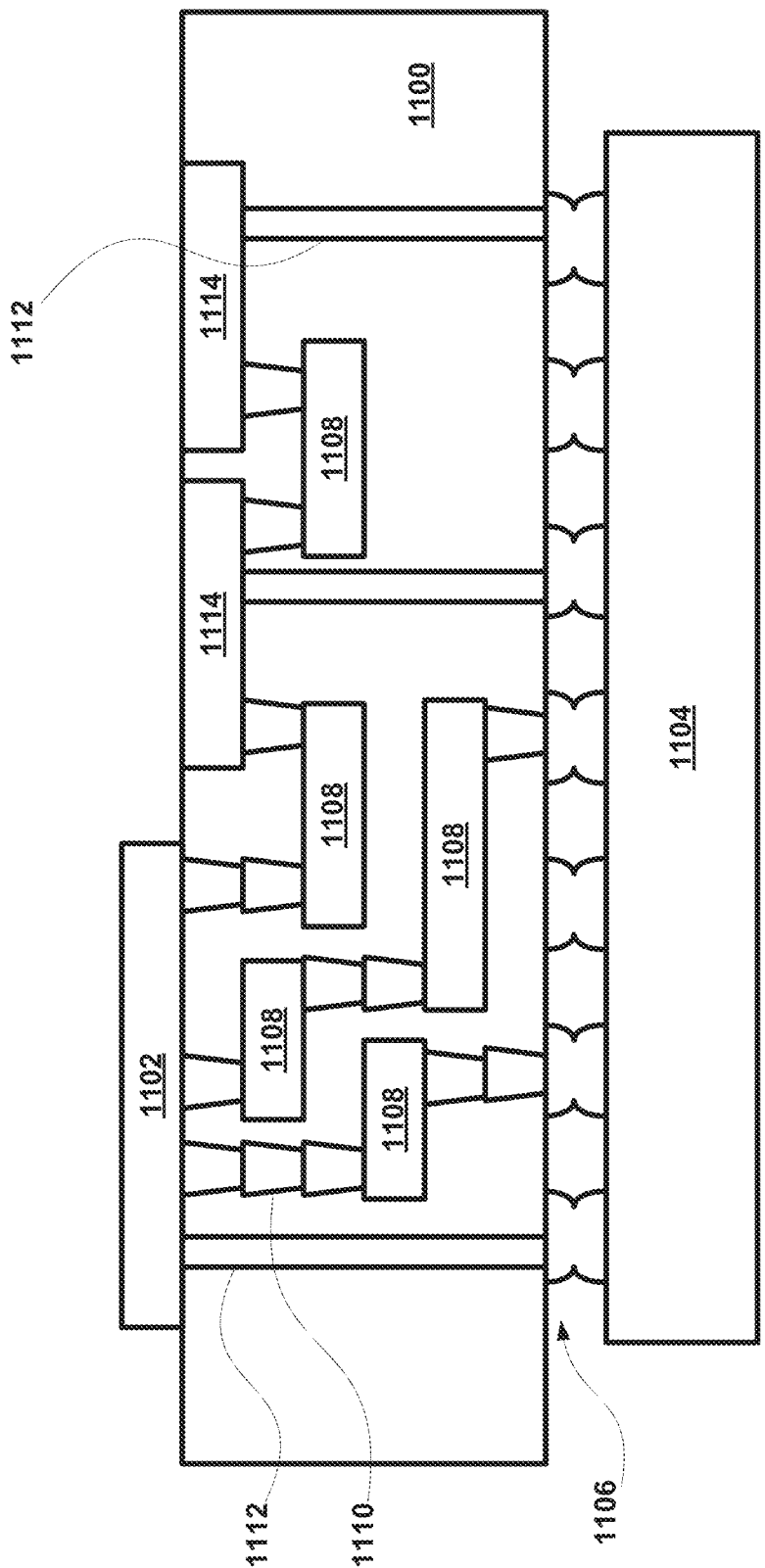
FIG. 11 illustrates an interposer that includes one or more embodiments of the disclosure.

FIG. 11 illustrates an interposer 1100 that includes one or more embodiments of the disclosure. The interposer 1100 is an intervening substrate used to bridge a first substrate 1102 to a second substrate 1104. The first substrate 1102 may be, for instance, an integrated circuit die. The second substrate 1104 may be, for instance, a memory module, a computer motherboard, or another integrated circuit die. Generally, the purpose of an interposer 1100 is to spread a connection to a wider pitch or to reroute a connection to a different connection. For example, an interposer 1100 may couple an integrated circuit die to a ball grid array (BGA) 1106 that can subsequently be coupled to the second substrate 1104. In some embodiments, the first and second substrates 1102/1104 are attached to opposing sides of the interposer 1100. In other embodiments, the first and second substrates 1102/1104 are attached to the same side of the interposer 1100. And in further embodiments, three or more substrates are interconnected by way of the interposer 1100.

The interposer 1100 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group IIII-V and group IV materials.

The interposer may include metal interconnects 1108 and vias 1110, including but not limited to through-silicon vias (TSVs) 1112. The interposer 1100 may further include embedded devices 1114, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1100.

In accordance with embodiments of the disclosure, apparatuses or processes disclosed herein may be used in the fabrication of interposer 1100.

Figure 12:
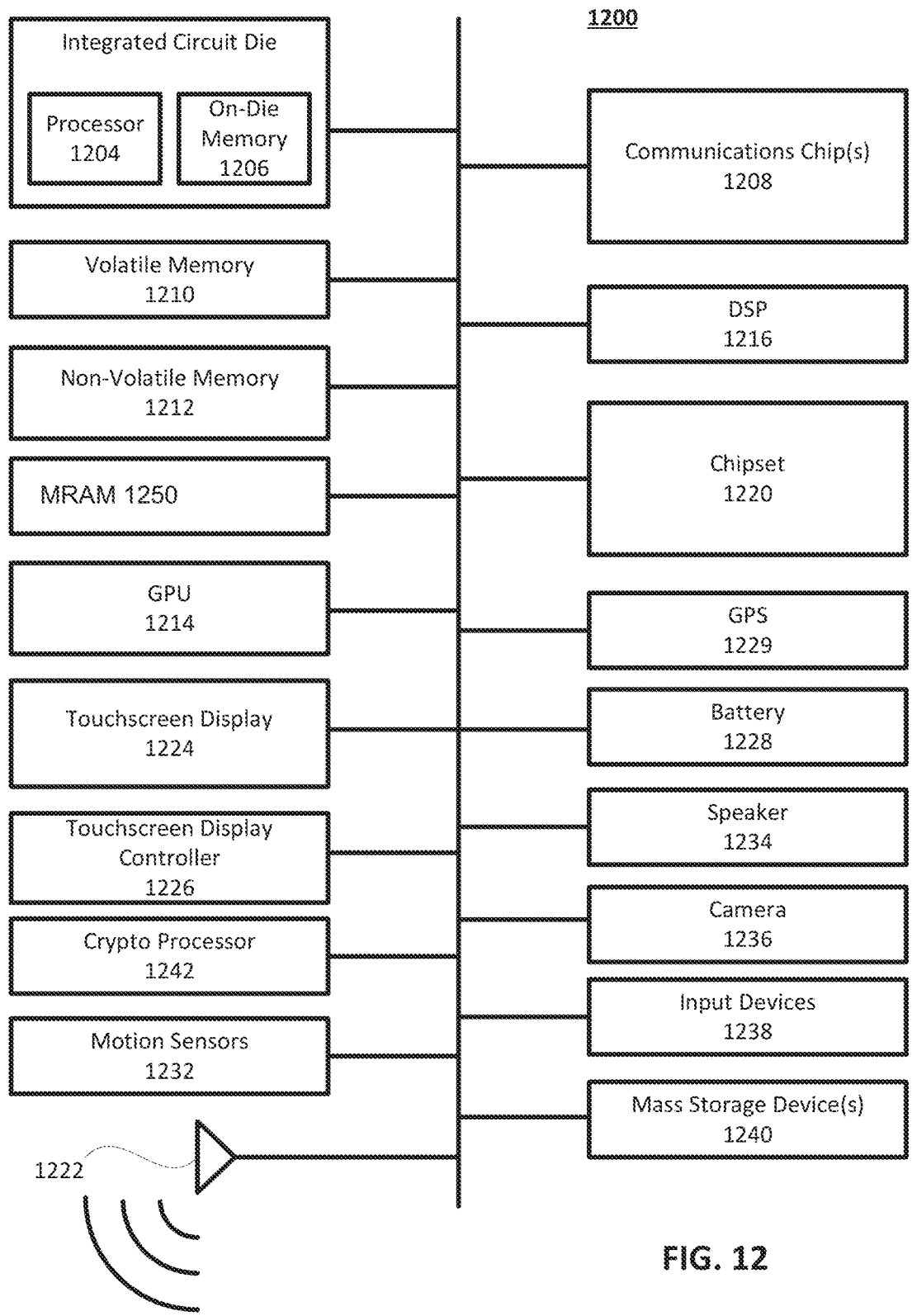
FIG. 12 illustrates a computing device in accordance with one embodiment of the disclosure.

FIG. 12 illustrates a computing device 1200 in accordance with one embodiment of the disclosure. The computing device 1200 may include a number of components. In one embodiment, these components are attached to one or more motherboards. In an alternate embodiment, some or all of these components are fabricated onto a single system-on-a-chip (SoC) die. The components in the computing device 1200 include, but are not limited to, an integrated circuit die 1202 and at least one communications logic unit 1208. In some implementations the communications logic unit 1208 is fabricated within the integrated circuit die 1202 while in other implementations the communications logic unit 1208 is fabricated in a separate integrated circuit chip that may be bonded to a substrate or motherboard that is shared with or electronically coupled to the integrated circuit die 1202. The integrated circuit die 1202 may include a CPU 1204 as well as on-die memory 1206, often used as cache memory, that can be provided by technologies such as embedded DRAM (eDRAM) or spin-transfer torque memory (STTM or STT-MRAM).

Computing device 1200 may include other components that may or may not be physically and electrically coupled to the motherboard or fabricated within an SoC die. These other components include, but are not limited to, volatile memory 1210 (e.g., DRAM), non-volatile memory 1212 (e.g., ROM or flash memory), a graphics processing unit 1214 (GPU), a digital signal processor 1216, a crypto processor 1242 (a specialized processor that executes cryptographic algorithms within hardware), a chipset 1220, an antenna 1222, a display or a touchscreen display 1224, a touchscreen controller 1226, a battery 1228 or other power source, a power amplifier (not shown), a voltage regulator (not shown), a global positioning system (GPS) device 1229, a compass 1230, a motion coprocessor or sensors 1232 (that may include an accelerometer, a gyroscope, and a compass), a speaker 1234, a camera 1236, user input devices 1238 (such as a keyboard, mouse, stylus, and touchpad), and a mass storage device 1240 (such as hard disk drive, compact disk (CD), digital versatile disk (DVD), and so forth).

The communications logic unit 1208 enables wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 1208 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G. and beyond. The computing device 1200 may include a plurality of communications logic units 1208. For instance, a first communications logic unit 1208 may be dedicated to shorter range wireless communications such as Wi-Fi and Bluetooth and a second communications logic unit 1208 may be dedicated to longer range wireless communications such as GPS, EDGE, GPRS, CDMA, WiMAX, LTE, Ev-DO, and others.

In various embodiments, the computing device 1200 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

The relative sizes of features shown in the figures are not drawn to scale.

The following paragraphs provide examples of various ones of the embodiments disclosed herein.

Example 1 is an apparatus that includes a piezo-electric element including a top-side electrode and a bottom-side electrode; a metal contact pad electrically connected to the bottom-side electrode; an electrode electrically connected to the top-side electrode; and an encasement encasing the piezo-electric element.

Example 2 may include the subject matter of example 1, wherein at least a portion of the top-side electrode is exposed from the encasement.

Example 3 may include the subject matter of any of examples 1 or 2, wherein the piezo-electric element includes a first top surface and a second top surface, the second top surface defining a shelf with the first top surface, the top electrode electrically connected to the first top surface and the second top surface.

Example 4 may include the subject matter of example 3, wherein the electrode is electrically connected to the second top surface by a wirebond.

Example 5 may include the subject matter of any of examples 1-4, wherein the apparatus includes a dual-flat no-lead housing, and wherein the first top surface protrudes from the dual-flat no-lead housing and wherein the second top surface and the top-side electrode are electrically connected to an lead frame of the dual-flat no-lead housing.

Example 6 may include the subject matter of example 5, wherein the electrode includes a lead frame exposed from the encasement.

Example 7 may include the subject matter of example 6, wherein the lead frame is angled substantially 90 degrees from the metal contact pad.

Example 8 may include the subject matter of example 3, wherein the electrode includes a first lead frame and the metal contact pad includes a second lead frame, wherein the second top surface contacts the first lead frame and the bottom-side electrode is electrically connected to the second lead frame by a wire.

Example 9 may include the subject matter of example 1, further including a printed circuit substrate, the printed circuit substrate electrically connected to the metal pad and to the electrode.

Example 10 may include the subject matter of example 1, wherein the piezo-electric element includes a first top surface and a second top surface, the second top surface defining a shelf with the first top surface, the top electrode electrically connected to the first top surface and the second top surface; and wherein the piezo-electric element is supported by a flex circuit, the flex circuit including a base substrate electrically connected to the metal pad and a top substrate, the first top surface protruding from the top substrate and wherein the second top surface is electrically connected to a top electrode of the top substrate of the flex circuit.

Example 11 is a method for preparing a piezo element, the method including providing a polarized piezo-electric wafer; creating a plurality of trenches in the polarized piezo-electric wafer in a first direction; plating the polarized piezo-electric wafer with a conductive metal; and dicing the piezo-electric wafer to create individual piezo elements by singulating the polarized piezo-electric wafer.

Example 12 may include the subject matter of example 11, further including providing a base substrate of a printed circuit substrate, the base substrate including a die pad; providing a top-side substrate of the printed circuit substrate, the top-side substrate including a through-hole via and a flex circuit electrode adjacent the through-hole via; placing the individual piezo element onto the top-side substrate, the piezo element including a top-side electrode positioned through the through-hole via, the piezo element including a step electrode contacting the flex circuit electrode; and placing the base substrate onto the top-side substrate and the piezo element, the piezo element including a bottom side electrode, wherein placing the base substrate includes placing the base substrate onto the piezo element with the die pad aligned with the bottom electrode of the piezo element.

Example 13 may include the subject matter of example 12, further including providing a metallization layer on the base substrate and the top-side substrate prior to placing the piezo element.

Example 14 may include the subject matter of example 13, wherein the metallization layer includes one of a solder paste, an electroless nickel and gold metallization or a silver epoxy.

Example 15 may include the subject matter of any of examples 11-13, further including placing a pressure sensitive adhesive lasered sheet to the base substrate and the top-side substrate.

Example 16 may include the subject matter of any of examples 11-13 or 15, further including providing a stiffener to one of the base substrate or the top-side substrate prior to placing the base substrate on the top-side substrate.

Example 17 may include the subject matter of example 16, wherein the stiffener includes one of an injected molded plastic or 2Layer FR-4, printed circuit board.

Example 18 may include the subject matter of any of examples 11-13 or 15 or 16, further including applying a solder flow over the base substrate and top-side substrate; and heat curing the base substrate and top-side substrate.

Example 19 may include the subject matter of example 11, wherein the individual piezo element includes a bottom-side electrode and a top-side electrode, the top-side electrode including a first top surface and a second top surface, the second top surface defining a shelf with the first top surface, the top electrode electrically connected to the first top surface and the second top surface; and wherein plating the polarized piezo-electric wafer with a conductive metal includes plating the first top surface and the second stop surface.

Example 20 may include the subject matter of example 19, further including providing a die pad and lead frame; applying a die attach epoxy to the die pad; placing the bottom side electrode onto the die pad; wire bonding the lead frame to the second top surface; and encasing the piezo element with a polymer encasement, wherein the first top surface protrudes from the encasement.

Example 21 is a system including a piezo-electric package that includes a piezo-electric element including a top-side electrode and a bottom-side electrode; a metal contact pad electrically connected to the bottom-side electrode; an electrode electrically connected to the top-side electrode; and an encasement encasing the piezo-electric element. The system also includes a controller to provide electrical signals to the metal contact pad and the electrode.

Example 22 may include the subject matter of example 21, further including a glass substrate coupled to the top-side electrode by a bonding material.

Example 23 may include the subject matter of any of examples 21-22, wherein the piezo-electric package is electrically and mechanically connected to a printed circuit board.

Example 24 may include the subject matter of example 22, wherein the piezo-electric element includes a first top surface and a second top surface, the second top surface defining a shelf with the first top surface, the top electrode electrically connected to the first top surface and the second top surface, wherein the first top surface protrudes from the encasement, and wherein the first top surface is coupled to the glass substrate by the bonding material.

Example 25 may include the subject matter of example 21, wherein the system includes an active probe pen, the controller housed in a housing of the active probe pen, the piezo-electric package encased in a tip of the active probe pen.

In the preceding description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding, the present disclosure; however, the order of description should not be construed to imply that these operations are necessarily order dependent. In particular, these operations need not be performed in the order of presentation.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

What is claimed is:

1. An apparatus comprising:
a piezo-electric element comprising a top-side electrode and a bottom-side electrode;
a metal contact pad electrically connected to the bottom-side electrode;
an electrode electrically connected to the top-side electrode;
a dual-flat no-lead housing; and
an encasement encasing the piezo-electric element, wherein:
the piezo-electric element comprises a first top surface and a second top surface, the second top surface defining a shelf with the first top surface, the top electrode electrically connected to the first top surface and the second top surface,
the first top surface protrudes from the dual-flat no-lead housing, and
the second top surface and the top-side electrode are electrically connected to a lead frame of the dual-flat no-lead housing.

2. The apparatus of claim 1, wherein at least a portion of the top-side electrode is exposed from the encasement.

3. The apparatus of claim 1, wherein the electrode is electrically connected to the second top surface by a wire-bond.

4. The apparatus of claim 1, wherein the electrode comprises a lead frame exposed from the encasement.

5. The apparatus of claim 4, wherein the lead frame is angled substantially 90 degrees from the metal contact pad.

6. The apparatus of claim 1, wherein the electrode comprises a first lead frame and the metal contact pad comprises a second lead frame, wherein the second top surface contacts the first lead frame and the bottom-side electrode is electrically connected to the second lead frame by a wire.

7. The apparatus of claim 1, further comprising a printed circuit substrate, the printed circuit substrate electrically connected to the metal pad and to the electrode.

8. The apparatus of claim 1, wherein the piezo-electric element is supported by a flex circuit electrically connected to the metal pad and to the electrode.

9. A system comprising:
a piezo-electric package comprising:
a piezo-electric element comprising a top-side electrode and a bottom-side electrode;
a metal contact pad electrically connected to the bottom-side electrode;
an electrode electrically connected to the top-side electrode; and
an encasement encasing the piezo-electric element;
a substrate coupled to the top-side electrode by one of a bonding material or clamp; and
a controller to provide electrical signals to the metal contact pad and the electrode, wherein:
the piezo-electric element comprises a first top surface and a second top surface, the second top surface defining a shelf with the first top surface, the top electrode electrically connected to the first top surface and the second top surface, wherein the first top surface protrudes from the encasement, and wherein the first top surface is coupled to the substrate by the bonding material.

10. The system of claim 9, wherein the piezo-electric package is electrically and mechanically connected to a printed circuit board.

11. The system of claim 9, wherein the system comprises an active probe pen, the controller housed in a housing of the active probe pen, the piezo-electric package encased in a tip of the active probe pen.

12. An apparatus, comprising:
a piezo-electric element comprising a top-side electrode and a bottom-side electrode;
a metal contact pad electrically connected to the bottom-side electrode;
an electrode electrically connected to the top-side electrode; and
an encasement encasing the piezo-electric element, wherein:
the piezo-electric element comprises a first top surface and a second top surface,
the second top surface defines a shelf with the first top surface,
the top-side electrode is electrically connected to the first top surface and the second top surface,
the piezo-electric element is supported by a flex circuit,
the flex circuit comprises a base substrate and a top substrate,
the base substrate includes the metal contact pad and the electrode,
the first top surface of the piezo-electric element protrudes from the top substrate, and
the second top surface of the piezo-electric element is electrically connected to the electrode through the top substrate.

13. The apparatus of claim 12, wherein the top substrate includes a through-hole through which the first top surface protrudes.

14. The apparatus of claim 12, wherein:
the metal contact pad on the bottom substrate is a first metal contact pad,
the bottom substrate comprises a second metal contact pad electrically connected to the electrode,
the top substrate includes a third metal contact pad aligned with and in contact with the second metal contact pad on the bottom substrate,
the third metal contact pad is electrically connected to electrical contacts on the top substrate,
the electrical contacts are in contact with the second top surface of the piezo-electric element, such that the second top surface of the piezo-electric element is electrically connected to the electrode through the top substrate.

15. The apparatus of claim 12, further comprising a stiffener between the top substrate and the bottom substrate.

16. The apparatus of claim 15, wherein the stiffener is at least one of an injected molded plastic and a printed circuit board (PCB).

17. The apparatus of claim 12, wherein:
the metal contact pad on the bottom substrate is a first metal contact pad,
the bottom substrate comprises a conductive via electrically connected to the electrode,
the conductive via is electrically coupled to electrical contacts on the top substrate,
the electrical contacts are in contact with the second top surface of the piezo-electric element, such that the second top surface of the piezo-electric element is electrically connected to the electrode through the top substrate.

18. The apparatus of claim 17, further comprising a stiffener between the top substrate and a base substrate, wherein the stiffener comprises the conductive via.

19. The system of claim 9, wherein the substrate comprises glass.

20. The system of claim 9, wherein the substrate is a display of a device.

\* \* \* \* \*